US009548506B2

(12) United States Patent
Yamazaki et al.

(10) Patent No.: US 9,548,506 B2
(45) Date of Patent: Jan. 17, 2017

(54) FUEL CELL EVALUATOR AND FUEL CELL EVALUATION METHOD

(75) Inventors: Daisuke Yamazaki, Tokyo (JP); Tetsuo Yano, Tokyo (JP); Souichirou Torai, Tokyo (JP); Nobuhiro Tomosada, Tokyo (JP); Atsufumi Kimura, Tokyo (JP); Tomomi Akutsu, Tokyo (JP); Makoto Kawano, Tokyo (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 1171 days.

(21) Appl. No.: 13/314,795

(22) Filed: Dec. 8, 2011

(65) Prior Publication Data

US 2012/0145564 A1 Jun. 14, 2012

(30) Foreign Application Priority Data

Dec. 9, 2010 (JP) .................................. 2010-274391
Dec. 9, 2010 (JP) .................................. 2010-274392

(Continued)

(51) Int. Cl.
*G01R 15/00* (2006.01)
*H01M 8/04* (2016.01)
(Continued)

(52) U.S. Cl.
CPC ..... *H01M 8/04753* (2013.01); *H01M 8/04641* (2013.01); *G01R 31/3651* (2013.01);
(Continued)

(58) Field of Classification Search
CPC . G01R 27/02; G01R 31/3662; G01R 31/3651; H01M 10/42; H01M 2008/1095; H01M 8/04582; H01M 8/04641; H01M 8/04753; H01M 8/04552
(Continued)

(56) References Cited

U.S. PATENT DOCUMENTS 9,194,900 B2 * 11/2015 Torai ...................... G01R 27/02
2004/0257087 A1 * 12/2004 Murakami ................... 324/426
(Continued)

FOREIGN PATENT DOCUMENTS

CA 2735804 C * 11/2010
CN 1879251 A 12/2006
(Continued)

OTHER PUBLICATIONS

Mitsushima et.al., "Relationship between Current Distribution and Impedance in Porous Electrode", Electrochemistry, Japan, 2006 (English Translation).*
Mitsushima et.al, "Relationship between Current Distribution and Impedance in Porous Electrode", Electrochemistry, Japan, 2006.*
Mitsushima et.al, "Relationship between Current Distribution and Impedance in Porous Electrode", Electrochemistry, Japan, 2006 (English translation).*
(Continued)

*Primary Examiner* — An Do
(74) *Attorney, Agent, or Firm* — Sughrue Mion, PLLC

(57) ABSTRACT

In one embodiment, there is provided a fuel cell evaluator for evaluating a characteristic of a fuel cell based on a frequency characteristic of impedance of the fuel cell. The evaluator includes: an impedance acquisition unit configured to acquire impedances of the fuel cell for a certain current value in a Tafel region by changing a measurement frequency; an extraction unit configured to extract a reaction resistance from the acquired impedances; a calculator configured to calculate the product of the reaction resistance and the certain current value; and an indicator configured to indicate the product calculated by the calculator as the frequency characteristic of the impedance of the fuel cell.

12 Claims, 30 Drawing Sheets

US 9,548,506 B2
Page 2

(30) Foreign Application Priority Data

Dec. 28, 2010 (JP) ................................ 2010-292433
Oct. 14, 2011 (JP) ................................ 2011-226688

(51) Int. Cl.
*G01R 31/36* (2006.01)
*H01M 8/10* (2016.01)

(52) U.S. Cl.
CPC ..... *G01R 31/3662* (2013.01); *H01M 8/04552* (2013.01); *H01M 8/04582* (2013.01); *H01M 2008/1095* (2013.01); *Y02E 60/50* (2013.01)

(58) Field of Classification Search
USPC ..... 702/57, 58; 204/406, 412, 415; 324/629, 324/694, 698
See application file for complete search history.

(56) References Cited

U.S. PATENT DOCUMENTS

| | | | |
|---|---|---|---|
| 2007/0080668 A1 | 4/2007 | Al-Anbuky et al. | |
| 2008/0070075 A1* | 3/2008 | Yagi et al. | 429/23 |
| 2008/0238430 A1* | 10/2008 | Page | G01R 27/2605 |
| | | | 324/425 |
| 2009/0068506 A1* | 3/2009 | Tomura | H01M 8/0269 |
| | | | 429/431 |
| 2010/0086823 A1 | 4/2010 | Koshino et al. | |
| 2010/0141262 A1* | 6/2010 | Watanabe | H01M 8/04358 |
| | | | 324/430 |
| 2011/0300461 A1* | 12/2011 | Manabe | H01M 8/04649 |
| | | | 429/428 |
| 2012/0282525 A1* | 11/2012 | Nagai | H01M 4/505 |
| | | | 429/223 |
| 2014/0272651 A1* | 9/2014 | Kumei et al. | 429/429 |

FOREIGN PATENT DOCUMENTS

| | | |
|---|---|---|
| JP | 2005-71626 A | 3/2005 |
| JP | 2006-155965 A | 6/2006 |
| JP | 2007-265895 A | 10/2007 |
| JP | 2009-48813 A | 3/2009 |
| JP | 2009-48814 A | 3/2009 |
| JP | 2009-301917 A | 12/2009 |
| JP | 201044000 A | 2/2010 |
| JP | 2010-267472 A | 11/2010 |
| KR | 1020090121374 A | 11/2009 |
| WO | 2005/013409 A1 | 2/2005 |
| WO | 2008111570 A1 | 9/2008 |
| WO | WO 2011067982 A1 * | 6/2011 ............ H01M 4/505 |

OTHER PUBLICATIONS

Office Action, dated Apr. 5, 2013, issued by the Korean Patent Office in counterpart Korean Application No. 10-2011-0130838.

Yang, et al., "Analysis of AC Impedance in PEM FC under Low Humidity", ACTA Scientiarum Naturalium Universitatis Sunyatseni, vol. 49, No. 6, Nov. 2010, pp. 132-135.

Mitsushima, et al., "Relationship between Current Distribution and Impedance in Porous Electrode", Electrochemistry, pp. 810-814, 2006.

Wakabayashi, et al., "Temperature-dependence of oxygen reduction activity at a platinum electrode in an acidic electrolyte solution investigated with a channel flow double electrode", Journal of Electroanalytical Chemistry 574, 2005, pp. 339-346, 2005.

* cited by examiner

FIG. 29A
FIG. 29B
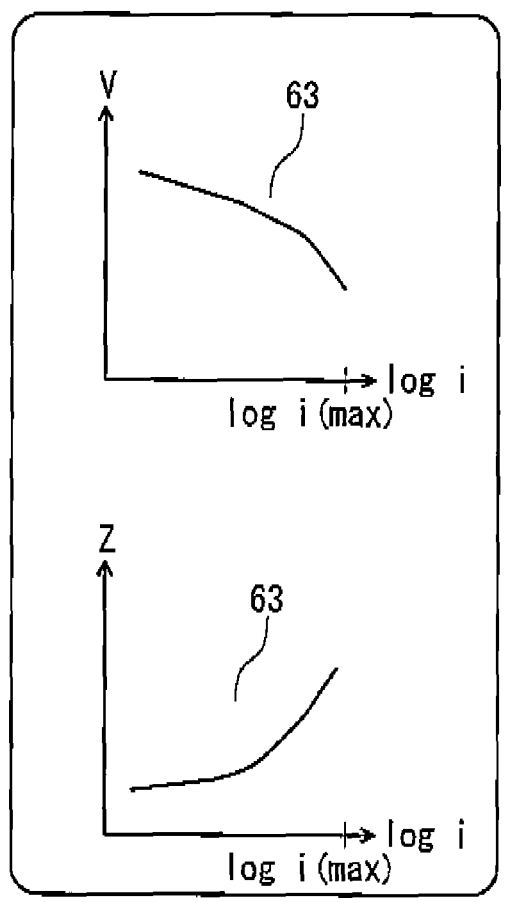
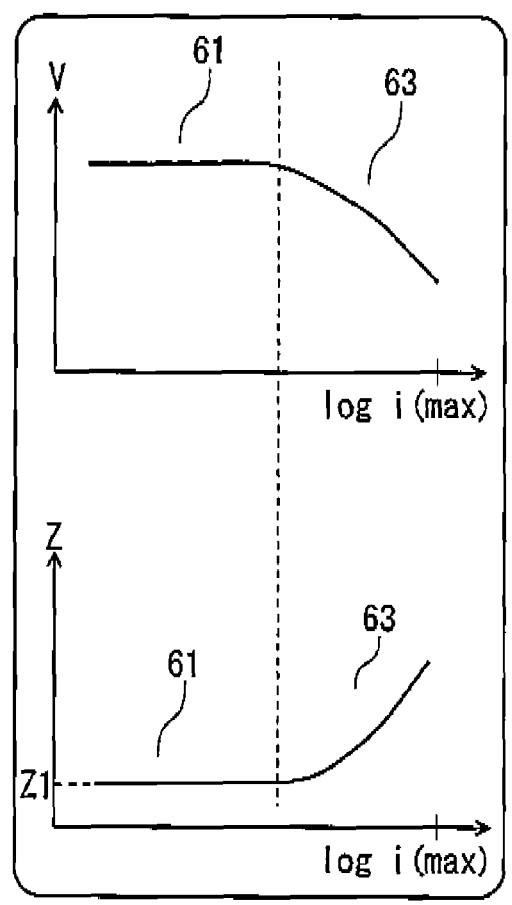

TAFEL PLOTS FOR OXYGEN REDUCTION REACTION IN SOLUTION SYSTEM
(quoted from J. Electroanal. Chem. 574 (2005) 339)

FUEL CELL EVALUATOR AND FUEL CELL EVALUATION METHOD

This application claims priority from Japanese Patent Applications No. 2010-274391, filed on Dec. 9, 2010, No. 2010-274392, filed on Dec. 9, 2010, No. 2010-292433, filed on Dec. 28, 2010, and No. 2011-226688, filed on Oct. 14, 2011, the entire contents of which are herein incorporated by reference.

BACKGROUND

Technical Field

The present disclosure relates to a fuel cell evaluator for evaluating characteristic of a fuel cell based on electrochemical measurement. Particularly, the present disclosure relates to a fuel cell evaluator using impedance as a value of characteristic evaluation.

Related Art

Electrode reaction in a fuel cell generally progresses through the three stages, i.e. (1) transportation of a reactant to an electrode surface; (2) charge transfer reaction on the electrode surface; and (3) deviation of a product from an electrode surface. To separate and analyze each stage of electrode reaction is very important for evaluation of factors of degradation in characteristic and performance of an electrode, etc. To know the dominant degree of each stage of electrode reaction is very important for evaluation of factors of degradation in characteristic and performance of an electrode, etc.

Particularly, to measure characteristics in a current region not affected by concentration overvoltage is effective for analysis of characteristic of an electrode per se, A tafel slope indicating the relation between the logarithm of current and potential is one of such characteristics. FIG. 15 shows the Tafel slope. As shown in FIG. 15, the Tafel slope varies according to regions b1 and b2. In the region b1, almost of a platinum surface is covered with adsorbed oxygen species (oxide film) so that a Tafel slope caused by reaction called Temkin-Type is observed. On the other hand, in the region b2, all oxide on the platinum surface is reduced so that a Tafel slope caused by reaction on a bare platinum surface called Langmuir-Type is observed.

As a method for separating and indicating overvoltage in a fuel cell, there is a technique disclosed in JP-A-2009-48814. According to this technique, a Tafel slope in a region of very low load (not higher than 0.01 A/cm$^2$) in Tafel plots is obtained and an activation overvoltage is calculated. Then, a film resistance value is obtained from a zero-crossing value on the high frequency side of impedance measurement, and a resistance overvoltage is obtained. Finally, the remaining part of overvoltage is regarded as concentration overvoltage.

Moreover, to measure characteristics in a current region not affected by concentration overvoltage is effective for analyzing characteristic of an electrode per se. A Tafel slope indicating the relation between the logarithm of current and potential is one of such characteristics. There is further known a method in which the horizontal axis is expressed in the logarithm of current density and the vertical axis is expressed in cell voltage so that a fuel cell is evaluated based on the size, etc. of the linear slope (Tafel slope). (see e.g., JP-A-2009-48813)

On the other hand, impedance is a method effective for totally evaluating electrode reaction from frequency characteristic. However, the magnitude of impedance changes sensitively according to change of the current value at a measurement operating point because reaction resistance ($R_{ct}$) of an electrode is inversely proportional to current (according to the Butler-Volmer equation). For this reason, it is necessary to evaluate impedance while discriminating between reaction stages of the regions b1 and b2.

There may be a case where actually measured impedance may include DC resistance (such as contact resistance, film resistance, etc.) and reaction resistance-independent impedance as in a distributed constant region indicating characteristic of a porous electrode. Because the Tafel slope is characteristic based on reaction resistance as described above, there are circumstances that the relation between the Tafel slope and impedance cannot be obtained accurately before only reaction resistance is extracted when the relation is to be acquired.

It is generally conceived that two Tafel slopes of −60 mV/dec (b1: with adsorbing process) and −120 mV/dec (b2: without adsorbing process) are present in oxygen reduction reaction. here is however a high possibility that the aforementioned region not larger than 0.01 A/cm$^2$ will be a region b1. Accordingly, there is a possibility that activation overvoltage at actually used current density will be undervalued if the Tafel slope (b1) obtained by this technique is used. It is therefore necessary to acquire the second Tafel slope (b2) in order to evaluate activation overvoltage appropriately. There is however a possibility that the influence of concentration overvoltage cannot be ignored in the load region not smaller than 0.01 A/cm$^2$. It is difficult to determine the place affected by concentration overvoltage and it is difficult to obtain the Tafel slope accurately in the region. In addition, because diffusion resistance varies according to the current value at the operating point, it has been heretofore difficult to evaluate diffusion resistance.

In evaluation of characteristic of a fuel cell according to the related art, particularly in evaluation of catalyst, it is necessary to acquire reproducible current-voltage characteristic (Tafel curve) for likelihood evaluation. It is however known that the Tafel curve varies according to the preprocessing condition and the environmental condition of measurement. Therefore, the preprocessing condition and the environmental condition of measurement must be trued up in order to measure the Tafel curve in a stable power generation state of the fuel cell. Accordingly, a lot of labor and man-hour is taken.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages.

It is an illustrative aspect of the invention to provide a fuel cell evaluator and a fuel cell evaluation method which can use impedance as a useful characteristic value for evaluation of electrode performance.

Further, it is another illustrative aspect of the invention to provide a fuel cell evaluator, which can evaluate diffusion performance and can contribute to evaluation of reaction processes in Tafel regions.

Still further, it is another illustrative aspect of the invention to provide a fuel cell evaluator and a fuel cell evaluation method which can grasp that the fuel cell is in a stable power generation state without adjustment of the preprocessing condition and the environmental condition of measurement.

According to one or more illustrative aspects of the present invention, there is provided a fuel cell evaluator for evaluating a characteristic of a fuel cell based on a frequency characteristic of impedance of the fuel cell. The evaluator includes: an impedance acquisition unit configured to acquire impedances of the fuel cell for a certain current value in a Tafel region by changing a measurement frequency; an extraction unit configured to extract a reaction resistance from the acquired impedances; a calculator configured to calculate the product of the reaction resistance and the certain current value; and an indicator configured to indicate the product calculated by the calculator as the frequency characteristic of the impedance of the fuel cell.

According to one or more illustrative aspects of the present invention, the extraction unit is configured to extract the reaction resistance by removing DC resistance components not involved in the reaction resistance from the impedances.

According to one or more illustrative aspects of the present invention, the extraction unit is configured to remove the DC resistance components in a distributed constant region.

According to one or more illustrative aspects of the present invention, the extraction unit is configured to remove the DC resistance components by using model fitting.

According to one or more illustrative aspects of the present invention, the impedance acquisition unit is configured to acquire impedances of the fuel cell for a plurality of current values in a plurality of Tafel regions; the extraction unit is configured to extract reaction resistances from the acquired impedances; and the calculator is configured to calculate the product of each of the reaction resistances and the corresponding current value.

According to one or more illustrative aspects of the present invention, there is provided a fuel cell evaluation method for evaluating a characteristic of a fuel cell based on a frequency characteristic of impedance of the fuel cell. The method includes: (a) acquiring impedances of the fuel cell for a certain current value in a Tafel region by changing a measurement frequency; (b) extracting a reaction resistance from the acquired impedances; (c) calculating the product of the reaction resistance and the certain current value; and (d) indicating the calculated product as the frequency characteristic of the impedance of the fuel cell.

According to one or more illustrative aspects of the present invention, there is provided a fuel cell evaluator for evaluating a characteristic of a fuel cell based on an electrochemical characteristic of the fuel cell. The evaluator includes: a Tafel plot acquisition unit configured to acquire Tafel plots of the fuel cell; and a diffusion region extraction unit configured to extract a diffusion region based on the Tafel plots, wherein a Tafel slope is proportional to a current in the diffusion region.

According to one or more illustrative aspects of the present invention, the fuel cell evaluator, further includes: an impedance acquisition unit configured to acquire impedances in the diffusion region by changing a current value and a measurement frequency; and a diffusion evaluation parameter calculator configured to calculate a ratio $\Delta Zi/\Delta i$ of a difference $\Delta Zi$ of the product of the impedance and a measurement current value to a difference $\Delta i$ of the measurement current value as a diffusion evaluation parameter C by changing the measurement current value.

According to one or more illustrative aspects of the present invention, the fuel cell evaluator, further includes: an estimation unit, configured to estimate impedances in a Tafel region as impedance at a lower limit current value of the diffusion region by using a difference $\Delta Oi$ between the lower limit current value and the measurement current value and the diffusion evaluation parameter C.

According to one or more illustrative aspects of the present invention, the diffusion evaluation parameter calculator is configured to calculate an evaluation parameter of a limiting diffusion current having frequency information obtained by transforming the diffusion evaluation parameter C according to a theoretical equation.

According to one or more illustrative aspects of the present invention, there is provided a fuel cell evaluation method for evaluating a characteristic of a fuel cell based on an electrochemical characteristic of the fuel cell. The method includes: (a) acquiring Tafel plots of the fuel cell; and (b) extracting a diffusion region based on the Tafel plots, wherein a Tafel slope is proportional to a current in the diffusion region.

According to one or more illustrative aspects of the present invention, the method further includes: (c) acquiring impedances in the diffusion region by changing a current value and a measurement frequency; and (d) calculating a ratio $\Delta Zi/\Delta i$ of a difference $\Delta Zi$ of the product of the impedance and a measurement current value to a difference $\Delta i$ of the measurement current value as a diffusion evaluation parameter C by changing the measurement current value.

According to one or more illustrative aspects of the present invention, the method further includes: (e) estimating impedances in a Tafel region as impedance at a lower limit current value of the diffusion region by using a difference $\Delta Oi$ between the lower limit current value and the measurement current value and the diffusion evaluation parameter C.

According to one or more illustrative aspects of the present invention, step (d) includes: (d-1) calculating an evaluation parameter of a limiting diffusion current having frequency information obtained by transforming the diffusion evaluation parameter C according to a theoretical equation.

According to one or more illustrative aspects of the present invention, there is provided a fuel cell evaluator for evaluating a characteristic of a fuel cell in a power generation state. The evaluator includes: an impedance acquisition unit configured to acquire impedances of the fuel cell by changing a current value while measuring a characteristic of the fuel cell; and a calculator configured to calculate standardized impedances obtained by the product of the impedances and current densities corresponding to the impedances.

According to one or more illustrative aspects of the present invention, the calculator is configured to determine that the fuel cell is in a stable power generation state, by confirming two different Tafel regions, wherein the standardized impedance for each of the current densities is constant in the respective Tafel regions.

According to one or more illustrative aspects of the present invention, the fuel cell evaluator further includes: an indicator configured to indicate the standardized impedances as an index for the power generation state of the fuel cell.

According to one or more illustrative aspects of the present invention, there is provided a fuel cell evaluation method for evaluating a characteristic of a fuel cell in a power generation state. The method includes: (a) acquiring impedances of the fuel cell by changing a current value while measuring a characteristic of the fuel cell; and (b)

calculating standardized impedances obtained by the product of the impedances and current densities corresponding to the impedances.

According to one or more illustrative aspects of the present invention, the method further includes: (c) determining that the fuel cell is in a stable power generation state, by confirming two different Tafel regions, wherein the standardized impedance for each of the current densities is constant in the respective Tafel regions.

Other aspects and advantages of the present invention will be apparent from the following description, the drawings and the claims.

BRIEF DESCRIPTION OF THE DRAWINGS

FIGS. 19A and 19B are graphs showing Tafel plots, in which FIG. 19A is a graph showing current-Tafel slope characteristic and FIG. 19B is a graph showing logarithm of current-Tafel slope characteristic;

FIGS. 26A and 26B are diagrams showing a fuel cell (assembly cell) evaluator, in which FIG. 26A is a diagram showing a section of a fuel cell at the time of measuring characteristic of the fuel cell and a method of connection at the measuring time and FIG. 26B is a block diagram functionally showing the configuration of the evaluator.

FIGS. 27A to 27C are graphs showing examples of measured data, in which FIG. 27A is a graph showing voltage-current characteristic, FIG. 27B is a graph showing standardized impedance Z-current characteristic and FIG. 27C is a graph showing Cole-Cole plots of standardized impedance Z;

FIGS. 29A and 29B are graphs illustrating current-voltage characteristic and standardized impedance obtained in a stage of an unstable power generation state.

DETAILED DESCRIPTION

Exemplary embodiments (Embodiments 1 to 3) of a fuel cell evaluator according to the invention will be described below.

Embodiment 1

Figure 1:
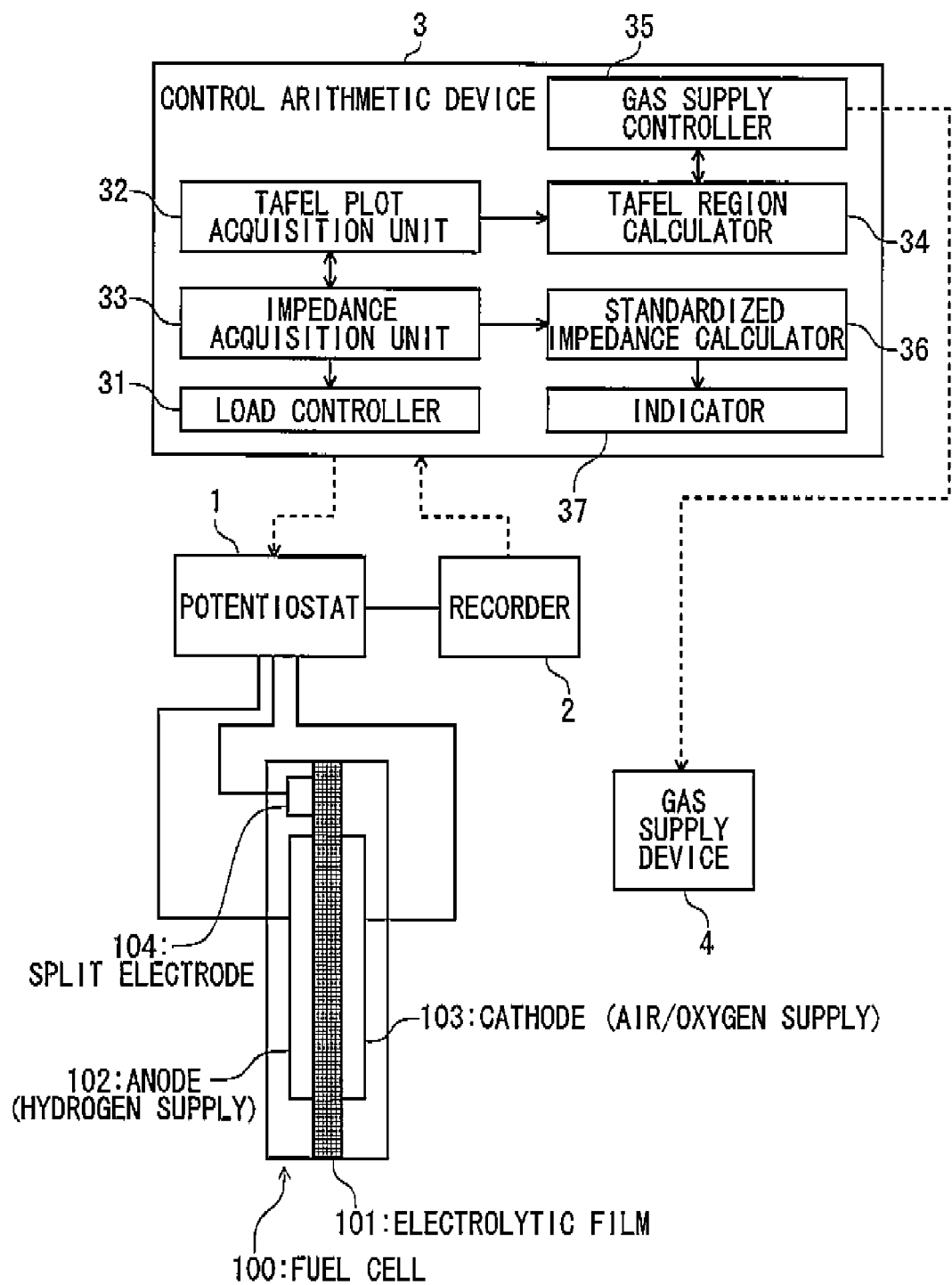
FIG. 1 is a block diagram showing a fuel cell measuring system.

FIG. 1 is a block diagram showing a fuel cell measuring system as a fuel cell evaluator according to Embodiment 1.

The fuel cell 100 shown in FIG. 1 is a single cell which has such a structure that an electrolytic film 101 having a surface modified with Pt/C catalyst is held between an anode 102 having a gas diffusion layer and a cathode 103 having a gas diffusion layer. A split electrode 104 split from the anode 102 is provided on a side of the anode 102. The anode 102 and the split electrode 104 are electrically insulated from each other.

At the time of measurement, hydrogen is supplied to the anode 102 and air or oxygen is supplied to the cathode 103 to make a power generation state. Electrochemical measurement is performed by a triode system. When cathode characteristic is evaluated, the cathode 103 is used as a working electrode while the anode 102 is used as a counter electrode. In addition, the anode-side, other split electrode 104 electrically insulated from the anode 102 and the cathode 103 is used as a reference electrode (RHE). As shown in FIG. 1, the anode 102, the cathode 103 and the split electrode 104 are connected to a potentiostat 1, so that respective results of measurement by the potentiostat 1 are transferred to a recorder 2.

As shown in FIG. 1, a control arithmetic device 3 is connected to the potentiostat 1 and the recorder 2. The control arithmetic device 3 executes control of the potentiostat 1, acquisition of the measurement results from the recorder 2 and arithmetic operation based on the acquired measurement results.

Hydrogen is supplied to the anode 102 of the fuel cell 100 while air or oxygen is supplied to the cathode 103. These supplied gases are given through a gas supply device 4 shown in FIG. 1. The gas supply device 4 is connected to the control arithmetic device 3, so that the gas concentration, flow rate, temperature, etc. of each gas supplied to the fuel cell 100 are controlled by the control arithmetic device 3 through the gas supply device 4.

As shown in FIG. 1, the control arithmetic device 3 has: a load controller 31 which controls the potentiostat 1; a Tafel plot acquisition unit 32 which acquires Tafel plots by changing the current value of the fuel cell 100 under a constant amount of supplied gas; an impedance acquisition unit 33 which acquires impedance of the fuel cell 100 based on measurement data (voltage value and current value) acquired by superposing an alternating current on a current of each current value; a Tafel region calculator 34 for extraction of a Tafel region which will be described later; a gas supply controller 35 which controls the gas supply device 3; a standardized impedance calculator 36 which applies a standardization process which will be described later to the impedance acquired by the impedance acquisition unit 33; and an indicator 37 which presents a result of calculation by the standardized impedance calculator 36.

Either voltage regulation or current regulation may be used for load control using the potentiostat 1. The voltage regulation or current regulation is controlled according to a condition designated by the load controller 31 so that measured data (voltage value/current value) are recorded by the recorder 2. Tafel plots are acquired by the Tafel plot acquisition unit 32, and gas concentration control is performed in such a manner that nitrogen is mixed with introduced gas by the gas supply controller 35 and the gas supply device 4. DC resistance correction of Tafel plots and concentration correction due to shifting, which will be described later, are performed by the Tafel region calculator 34. Impedance of the fuel cell 100 is acquired by the impedance acquisition unit 33. A series of standardization steps (steps S102 to S105 which will be described later) including correction of DC resistance and distributed constant region is performed by the standardized impedance calculator 36 so that a result of calculation is presented as a frequency characteristic value on a monitor or the like by the indicator 37. Besides raw data (voltage value/current value), results of calculation by the Tafel region calculator 34 and the standardized impedance calculator 36 may be recordable in the recorder 2.

Figure 2:
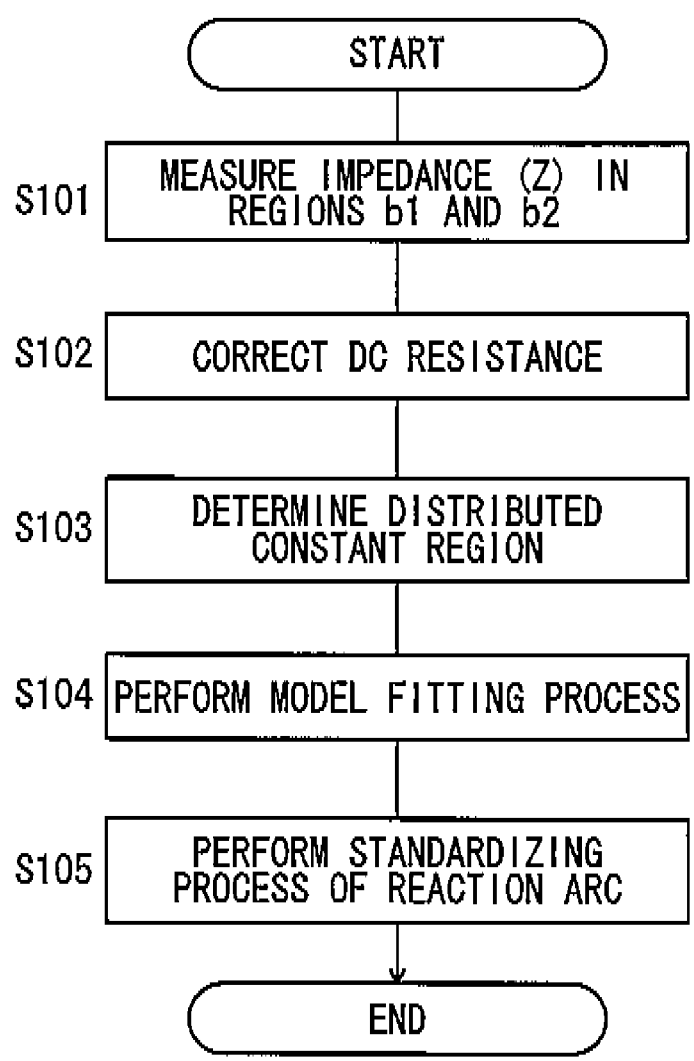
FIG. 2 is a flow chart showing a process of extracting reaction resistance and standardizing impedance.

FIG. 2 is a flow chart showing a process of extracting reaction resistance and standardizing impedance. Reaction resistance of the fuel cell 100 can be extracted and standardized impedance can be calculated in accordance with a procedure shown in this flow chart.

First, in step S101, impedance in each of regions b1 and b2 different in Tafel slope is measured. Although it is necessary to extract the regions b1 and b2 correctly in advance here, the extracting procedure will be described later.

Figure 3:
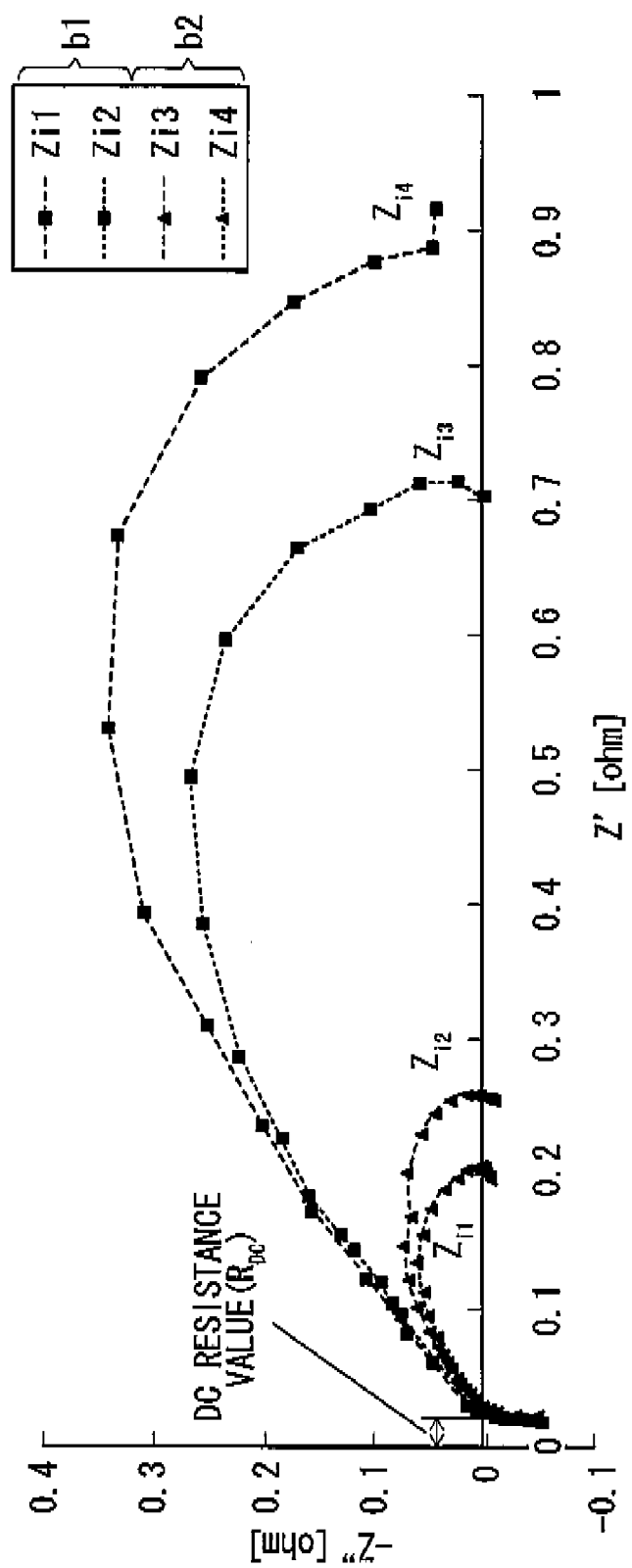
FIG. 3 is a graph showing impedance acquired based on measurement in regions b1 and b2.

FIG. 3 is a graph showing impedance acquired by the impedance acquisition unit 33 based on measurement in the regions b1 and b2. In FIG. 3, Zi1 represents impedance at current i1, Zi2 represents impedance at current i2, Zi3 represents impedance at current i3, and Zi4 represents impedance at current i4. The currents i1 and i2 correspond to the region b1 whereas the currents i3 and i4 correspond to the region b2. The currents i1 to i4 have the relation i1<i2<i3<i4.

An intersection point of the real axis of impedance is now defined as zero crossing. In the example shown in FIG. 3, it is found that the high frequency side zero crossing value is not zero but there is a DC resistance component ($R_{DC}$). Because the DC resistance component has no direct relation to reaction resistance, origin correction is performed in step S102 in such a manner that the high frequency side zero crossing value is regarded as a DC resistance value and the DC resistance value is subtracted.

Figure 4:
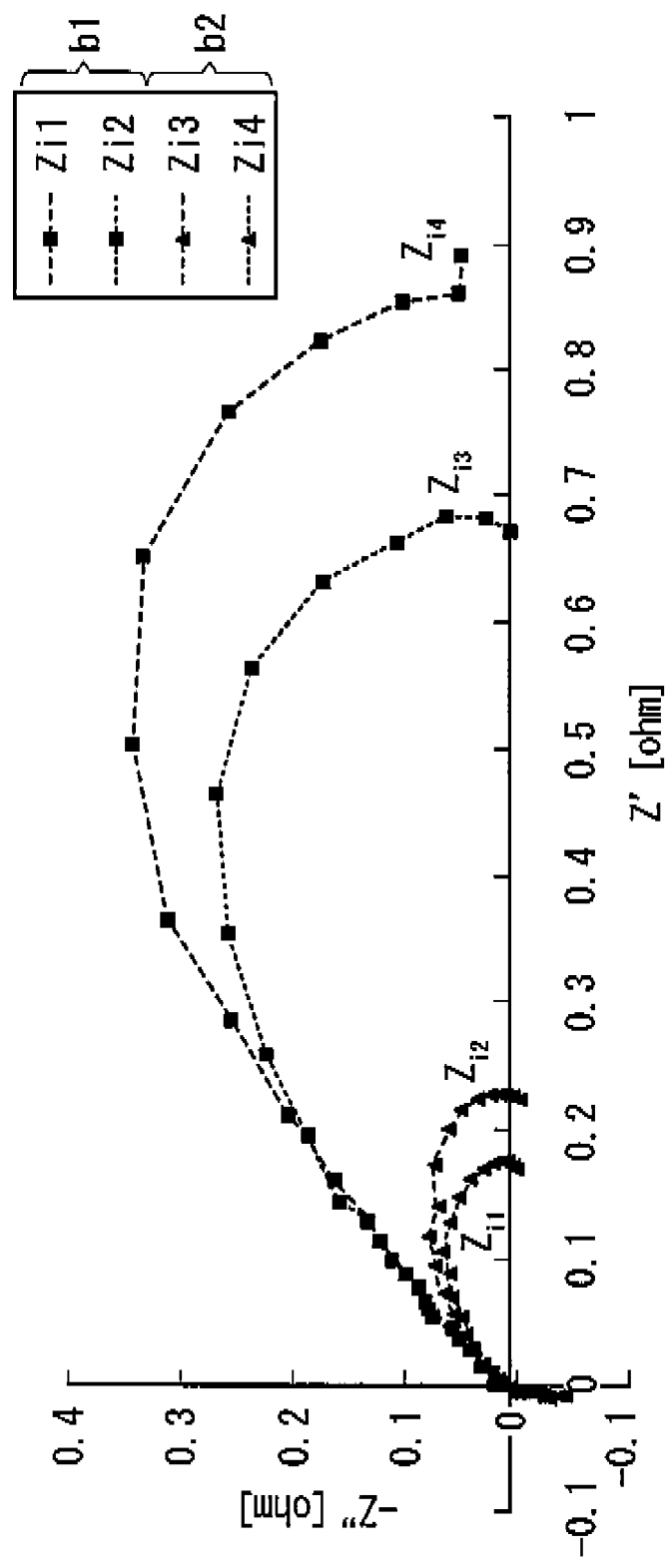
FIG. 4 is a graph showing impedance after DC resistance correction.

FIG. 4 is a graph showing impedance after DC resistance correction in the step S102. In FIG. 4, it can be confirmed that the high frequency side zero crossing value is set as the origin.

Figure 5:
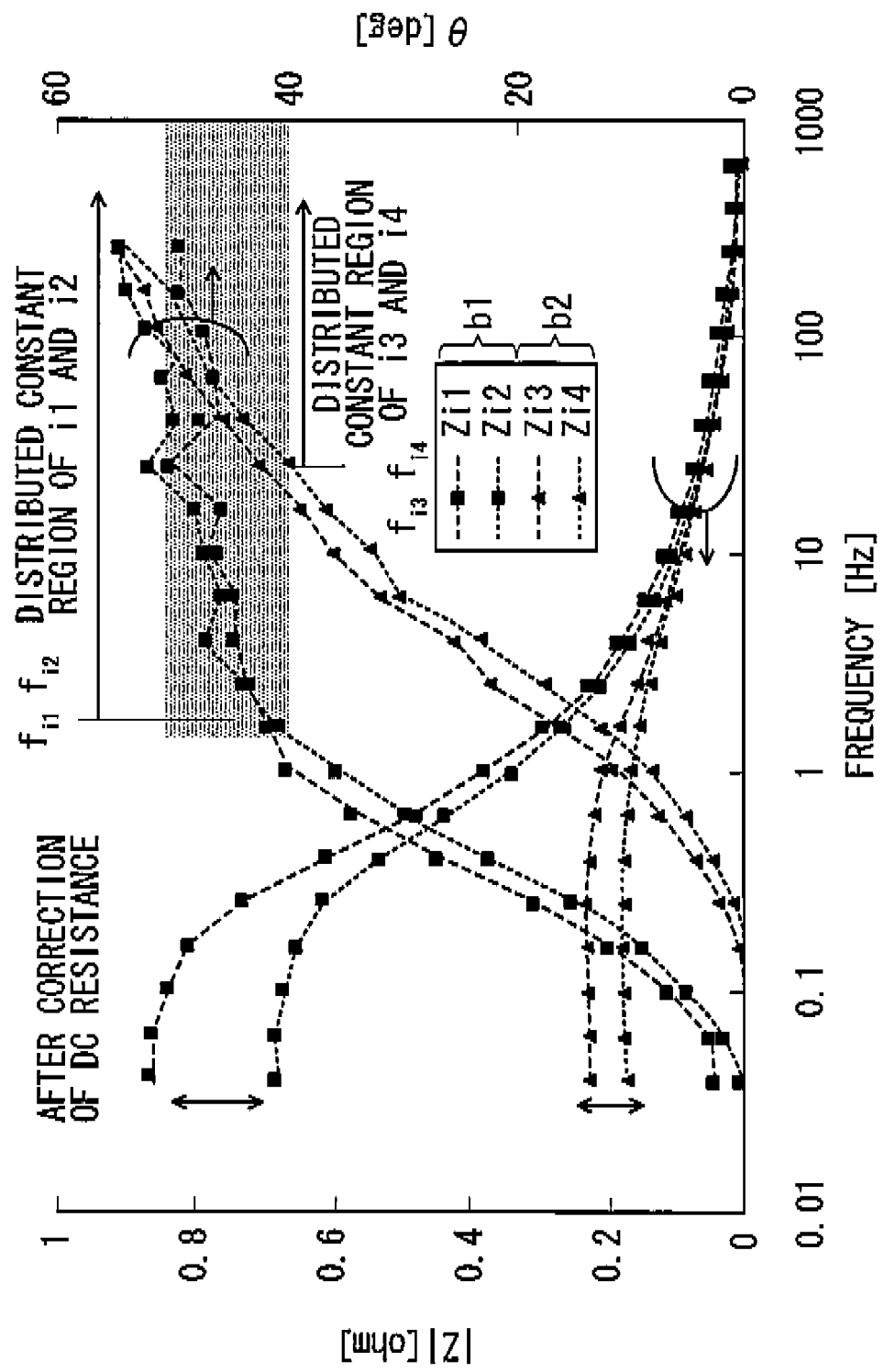
FIG. 5 is a graph showing |Z|–f characteristic and θ–f characteristic of impedance (after DC resistance correction) shown in FIG. 4.

FIG. 5 is a graph showing |Z|–f characteristic and θ–f characteristic of impedance (after DC resistance correction) shown in FIG. 4.

Then, in step S103, the distributed constant region is discriminated. It is found from FIGS. 4 and 5 that a linear region of impedance appears on the high frequency side. It is generally known that such a line of 45° appears on the high frequency side of a porous electrode (distributed constant region). Equations eq.1, eq.2 and eq.3 which are established with respect to the distributed constant region are given as follows, $$\text{As for crossover frequency } f_t, \ f_t = \frac{3}{2\pi R_{ion} C_{dl}} \qquad \text{eq. 1}$$

$$\text{As for impedance } Z', \ Z'_{high} = \frac{1}{\sqrt{\omega}} \sqrt{\frac{R_{ion}}{2C_{dl}}} \qquad \text{eq. 2}$$

$$\text{As for impedance } Z'', \ Z''_{high} = \frac{1}{\sqrt{\omega}} \sqrt{\frac{R_{ion}}{2C_{dl}}} \qquad \text{eq. 3}$$

$R_{ion}$ is proton shift resistance of a catalyst layer, and $C_{dl}$ is capacitance of an electric double layer.

It is apparent from these equations that the distributed constant region does not depend on reaction resistance $R_{ct}$. Accordingly, unless the distributed constant region is removed, reaction cannot be separated accurately by standardization which will be described later.

An example of a region judged to be a distributed constant region in step S103 is shown in FIG. 5. In the example shown in FIG. 5, the possibility that in-catalyst proton shift resistance ($R_{ion}$) or electric double layer capacitance ($C_{dl}$) will vary according to each reaction step is allowed so that a region of from the zero-crossing frequency to a frequency satisfying "a region having θ–f characteristic of 45°±5° (a gray zone portion)" and "not larger than 5% of difference of a low frequency zero crossing value in comparison of impedance |Z| different in operating point in the same reaction step" is judged to be a distributed constant region. Incidentally, the specific criterion for determining the distributed constant region can be changed suitably based on the thought that in-catalyst proton shift resistance does not change even in a different reaction step or the thought that the line is not limited to the 45' line.

Then, in step S104, a model fitting process except the distributed constant region is performed.

Figure 6:
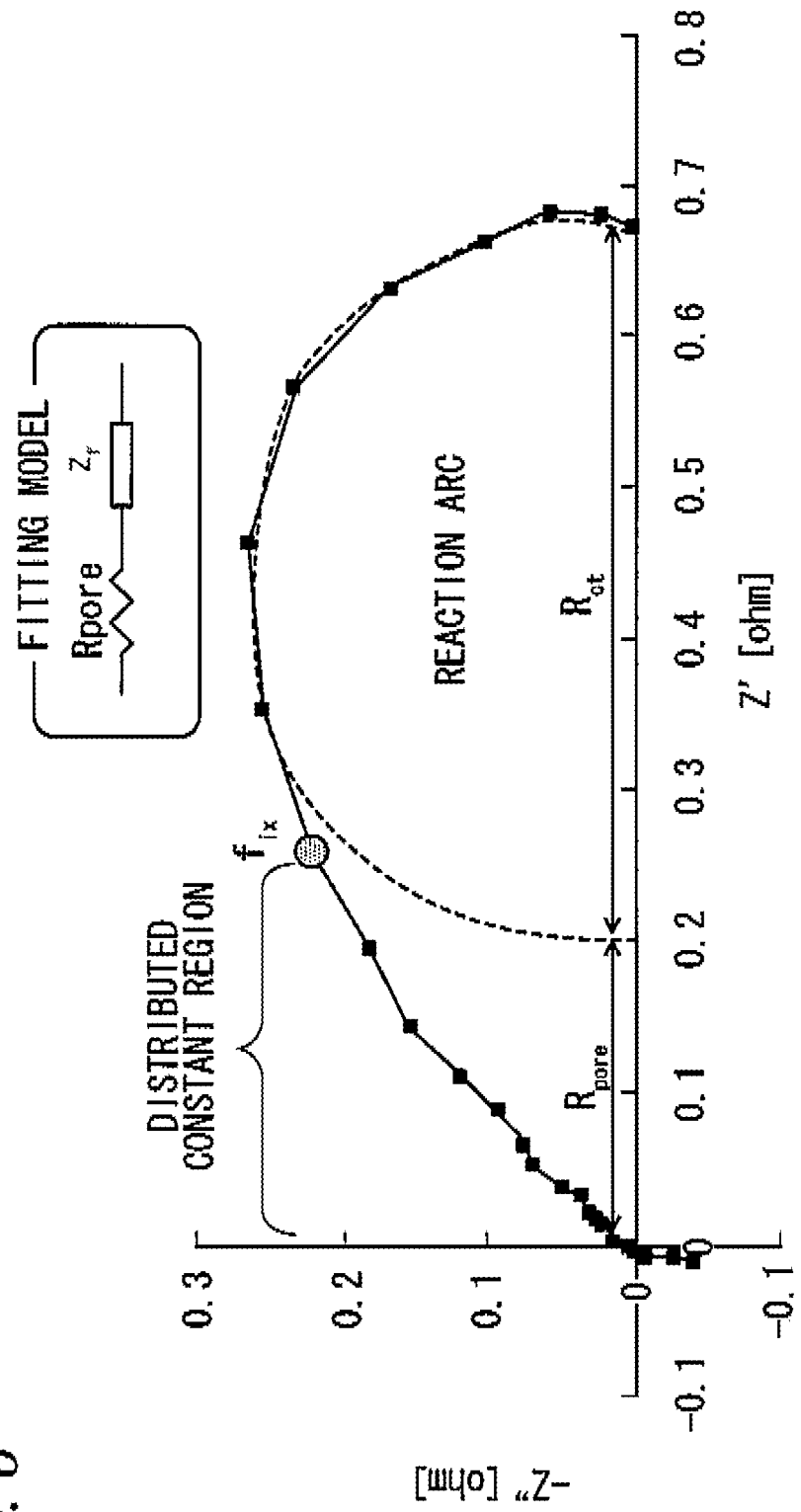
FIG. 6 is a graph showing a method for a model fitting process.

FIG. 6 is a graph showing the method of the model fitting process in the step S104. Here, a fitting software is used for performing model fitting of another frequency band than the distributed constant region, that is, only a low frequency band exhibiting the influence of reaction resistance. In FIG. 6, only data with respect to Zi3 are exemplified and an upper limit frequency in the distributed constant region with respect to Zi3 is set as $f_{ix}$. Here, DC resistance components caused by distribution characteristic (transmission line model) are generically defined as $R_{pore}$. A circuit in which $R_{pore}$ and a reaction impedance model ($Z_f$) are connected in series (as shown in FIG. 6) is used as an equivalent circuit model. It is preferable that a model regarded as expressing actual reaction steps is used as a reaction impedance model ($Z_f$). The model can be selected suitably. Here is shown an example in which a secondary model of R//C is simply used as $Z_f$ for performing fitting. By this fitting, values of $R_{ct}$ and $R_{pore}$ are obtained so that reaction resistance can be simply extracted as a reaction arc.

Figure 7:
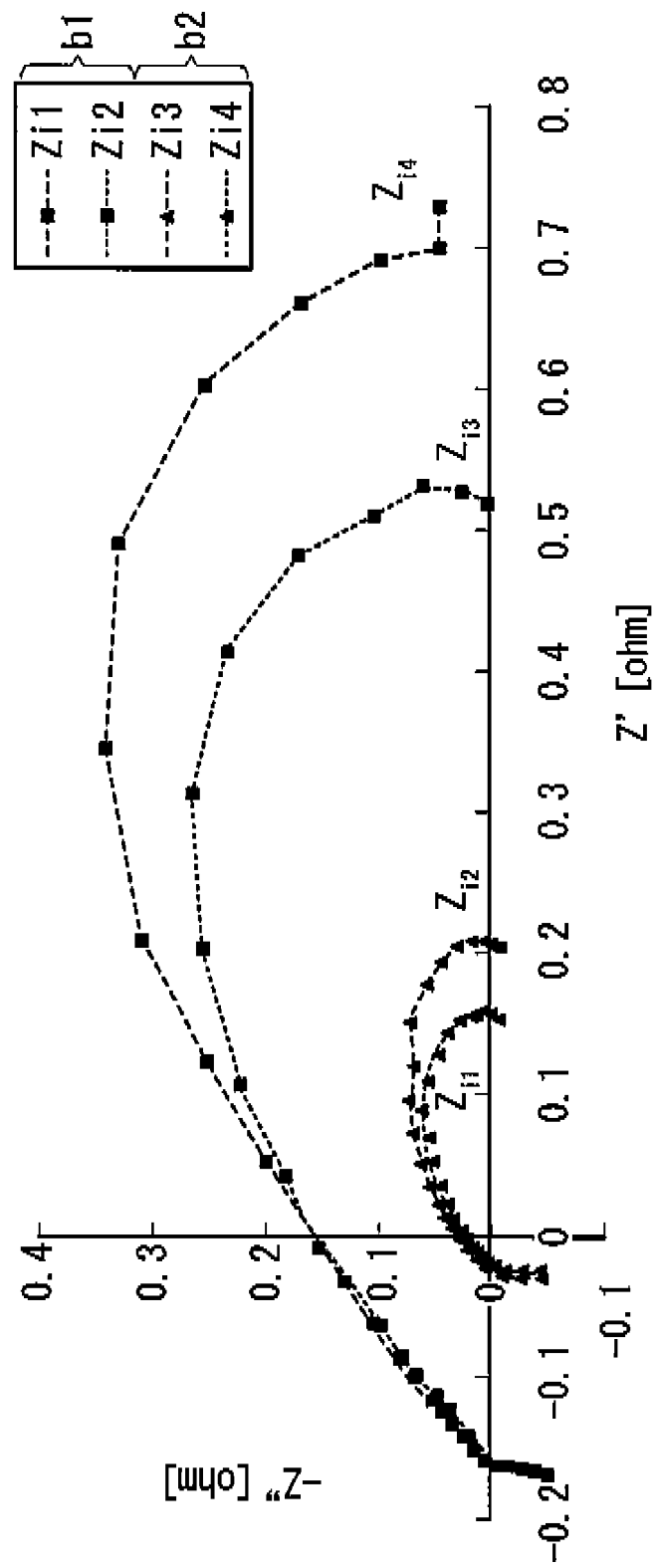
FIG. 7 is a graph showing impedance origin-corrected in consideration of the distributed constant region.

FIG. 7 is a graph showing impedance after origin correction in consideration of the distributed constant region. In FIG. 7, Rpore obtained by the aforementioned procedure is subtracted from impedance shown in FIG. 4 to correct the origin.

Here, because each of processes of the steps S102 and S104 is a process of removing DC resistant components, ($R_{pore}+R_{DC}$) may be collectively calculated in the step S104.

Then, in step S105, a standardizing process is applied to impedance after removal of DC resistance components and extraction of only reaction resistance. Here, a current value at each operating point of impedance measurement is multiplied by the origin-corrected impedance (FIG. 7) to thereby standardize impedance.

The relation between impedance and a measured current value at the time of measurement of impedance will be described here.

In a region where the influence of diffusion does not appear (concentration-independent region), current I and voltage E have the relation of a Tafel equation (equation eq.4). In the equation eq.4, b is a Tafel slope. On the other hand, for impedance measurement, impedance is calculated in accordance with an equation eq.5 on the assumption that response of an output voltage to AC modulation of an input current has a linear relation.

$$E = a + b \times \log I \quad \text{eq.4}$$

$$Z = \frac{dE}{dI} \quad \text{eq. 5}$$

From the equation eq.4, the concentration-independent region has the relation of an equation eq.6.

$$\frac{dE}{dI} = b \cdot \frac{1}{I} \quad \text{eq. 6}$$

Accordingly, in the concentration-independent region, the product I·Z of impedance Z and the measured current value I is a constant value.

This relation has been mentioned, for example, in the article entitled "*Analysis of Relationship between Current Distribution and Impedance in Porous Electrode*", Shigenori Mitsushima, Nobuyuki Kamiya and Ken-ichiro Ota, Electrochemistry, P. 810-814, 2006. In the article, there is a description that the deformation of the I-Z arc due to frequency change is used for considering the ratio of ion resistance to electron resistance.

Figure 8:
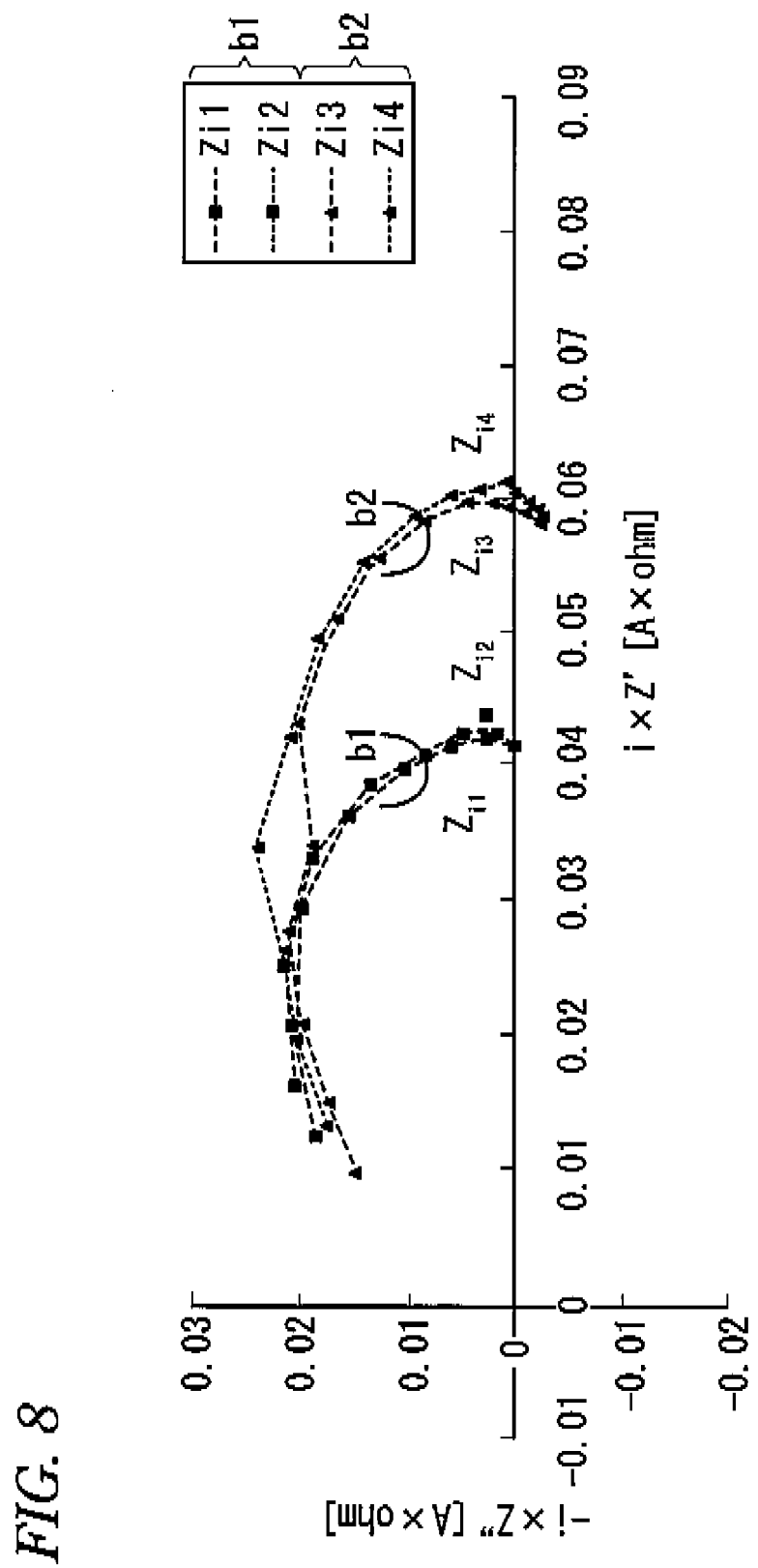
FIG. 8 is a graph showing impedance characteristic obtained by applying a standardizing process to extracted reaction resistance.

FIG. 8 is a graph showing impedance characteristic (frequency characteristic) obtained by applying a standardizing process to extracted reaction resistance. Such impedance characteristic is indicated by the indicator 37.

As shown in FIG. 8, it can be confirmed that standardized impedance can be separated accurately in accordance with each reaction process (region b1 or b2). That is, it is found that plots corresponding to Zi1 and Zi2 overlap each other substantially on one curve and plots corresponding to Zi3 and Zi4 overlap each other substantially on another curve. Accordingly, whether the reaction process of the region b1 or b2 is performed can be determined based on the impedance characteristic, and impedance at a different current value can be estimated. Moreover, characteristic of each reaction process can be discussed based on the shape, size, etc. of the standardized impedance. In addition, the standardized impedance can be used widely as a parameter indicating the performance of a fuel cell polyphenically.

Figure 9:
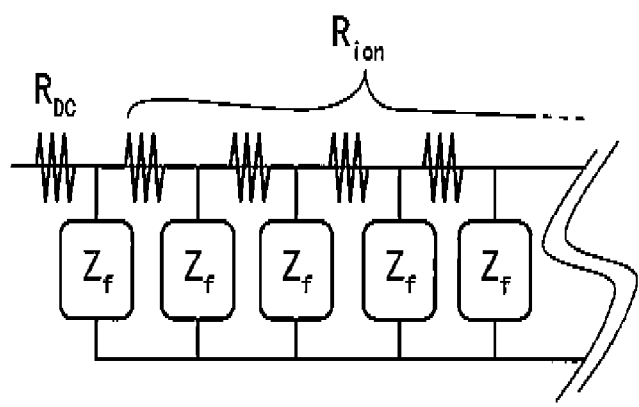
FIG. 9 is a view showing a transmission line model.

FIG. 9 is a view showing as transmission line model. In this model, proton shift resistance ($R_{ion}$) and reaction impedance are expressed by combination of a large number of DC resistance and a large number of impedance.

In the aforementioned exemplary embodiment, a distributed constant region and a lumped constant region at a certain frequency are distinguished so that model fitting is applied only to the lumped constant region to thereby extract reaction resistance simply. In practice, it is however impossible to separate the distributed constant region and the lumped constant region from each other clearly because a crossover frequency band in which the distributed constant region and the lumped constant region affect each other is present in a boundary region between the distributed constant region and the lumped constant region. On the contrary, when a general transmission line model as shown in FIG. 9 is used, reaction resistance can be extracted more accurately without provision of the process of determining the distributed constant region (step S103 in FIG. 2) because the distributed constant region, the crossover region and the lumped constant region can be entirely expressed so that fitting can be applied to all frequencies. However, the model shown in FIG. 9 has a large number of parameter elements, so that attention must be paid to the fact that divergence occurs easily at the time of fitting unless exact initial values are given to the parameter elements.

When a transmission line model is used for fitting in this manner, reaction resistance can be extracted more accurately. As a result, reaction resistance can be standardized more accurately.

As described above, it is necessary to extract the regions b1 and b2 correctly before impedance is measured in step S101. A procedure for extracting the regions b1 and b2 will be described below.

For extraction of the regions b1 and b2, gas concentration control is performed by the gas supply device 4 in accordance with a command from the gas supply controller 35. The gas concentration is adjusted in such a manner that the ratio of the flow rate of oxygen to the flow rate of nitrogen is changed while the total flow rate of gas introduced into the cathode 103 is fixed to avoid the influence of pressure change. On this occasion, the total flow rate of gas introduced into the cathode 103 is determined in advance so that the rate of utilization in oxygen concentration (e.g. oxygen concentrations C1 and C2 which will be described later) at the time of measurement becomes sufficiently low to avoid the influence of shortage of supplied oxygen on lowering of diffusion performance. That is, even when control is made to reduce concentration, the absolute amount of oxygen is kept to be supplied sufficiently. Arithmetic operations such as correction, slope derivation are performed in the control arithmetic device 3.

Figure 10:
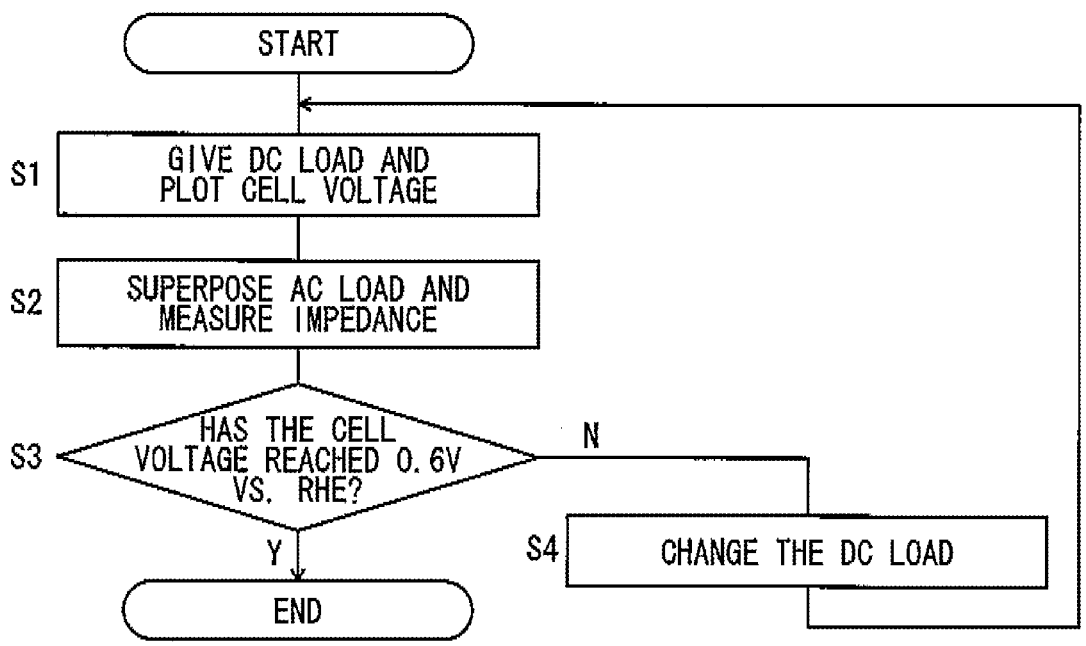
FIG. 10 is a flow chart showing a procedure of operation of a control arithmetic device.
Figure 10:
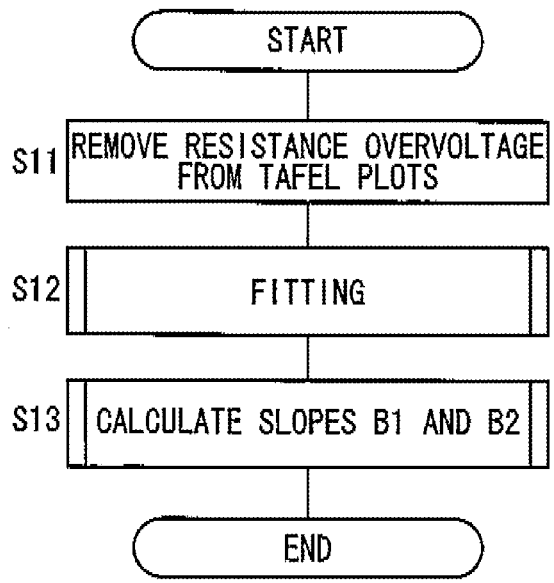

FIG. 10 is a flow chart showing a procedure of operation of the control arithmetic device 3.

In FIG. 10, steps S1 to S4 show processes for acquiring Tafel plots and measuring and acquiring values of film resistance.

In step S1 in FIG. 10, the oxygen concentration of gas introduced into the cathode 103 is controlled to be an oxygen concentration C1 to give a DC load ($I_o^{DC}$) to the fuel cell 100 so that a cell voltage value (Tafel plot) on this occasion is acquired and stored.

Then, in step S2, an AC load is further superposed on the DC load kept constant to thereby measure impedance at the DC operating point so that a result of measurement is stored.

Figure 11:
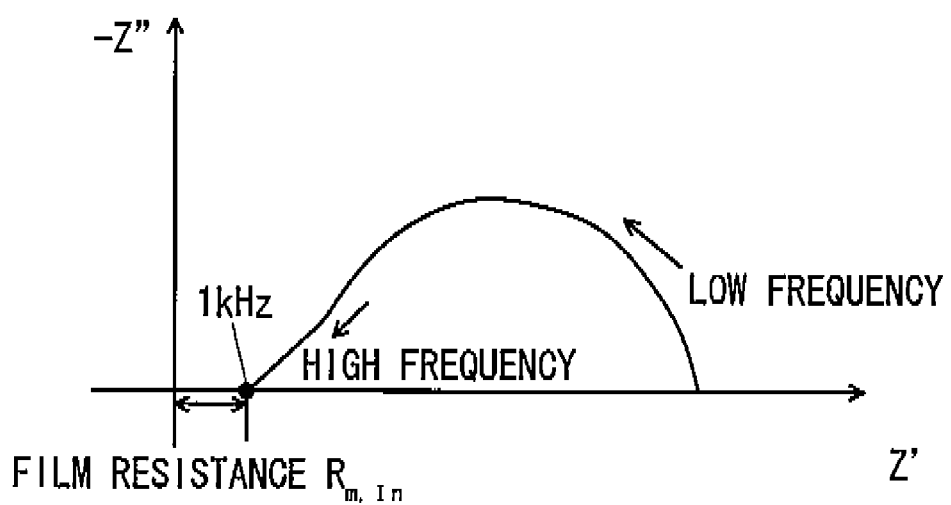
FIG. 11 is a graph illustrating frequency characteristic in the case where impedance of the fuel cell is measured while the AC frequency is changed.

FIG. 11 is a graph illustrating frequency characteristic when impedance of the fuel cell is measured while the AC frequency is changed. As shown in FIG. 11, impedance of the fuel cell generally exhibits zero-crossing on the high frequency side because of lowering of the resistance value but it is proved that the zero-crossing frequency is about 1 kHz experimentally. For this reason, impedance measurement in step S2 is performed, for example, using only AC of 1 kHz and the real part value on this occasion is defined as film resistance ($R_{r,Jn}$) at the current load. Accordingly, the time for measuring film resistance can be shortened. Incidentally, while the AC frequency is changed, impedance may be measured to calculate film resistance accurately.

Then, in step S3, whether the cell voltage at the current DC load ($I_k^{DC}$) has reached 0.6V vs. RHE or not is determined. If affirmative determination is made, processing is terminated. If negative determination is made, processing goes back to step S1.

In step S4, the DC load ($I_k^{DC}$) is increased by a predetermined value ($\Delta I$) and processing goes back to step S1. The relationship $I_{k+1}^{DC} - I_k^{DC} = \Delta I > 0$ is met.

In the expression, $\Delta I$ means a current step (increasing width of DC). It is preferable that a step not larger than 1 mA but as small as possible is used.

In this manner, in processing of the steps S1 to S4, acquisition of a Tafel plot and measurement and storage of the value of film resistance at each current load are repeated several times until the cell voltage reaches 0.6V vs. RHE. The reason why the cutoff voltage is 0.6V here is in that the second Tafel slope (slope b2) is observed when the cutoff voltage is not larger than 0.8V. Incidentally, the cutoff voltage can be reduced in accordance with the circumstances as long as the fuel cell 100 is not degraded.

Then, processing of the steps S1 to S4 is performed likewise under the condition of oxygen concentration C2 (C1>C2).

Steps S11 to S13 in FIG. 10 show a procedure of calculation of Tafel slopes.

In step S11 in FIG. 10, resistance overvoltage ($\eta_{f,Jn}$) at each current load is calculated based on the film resistance value obtained by the step S2 in accordance with the expression (1).

$$\eta_{r,Jn} = I_n^{DC} \times R_{r,Jn} \quad (1)$$

Moreover, in the step S11, the resistance overvoltage obtained in the step S2 with respect to each oxygen concentration (C1, C2) is subtracted from the Tafel plot obtained in the step S1 to thereby calculate a corrected Tafel plot.

Then, in step S12, a mobility coefficient $\alpha_C$ is calculated by use of the corrected Tafel plots obtained in the step S11. An example of this processing will be described below.

Figure 12:
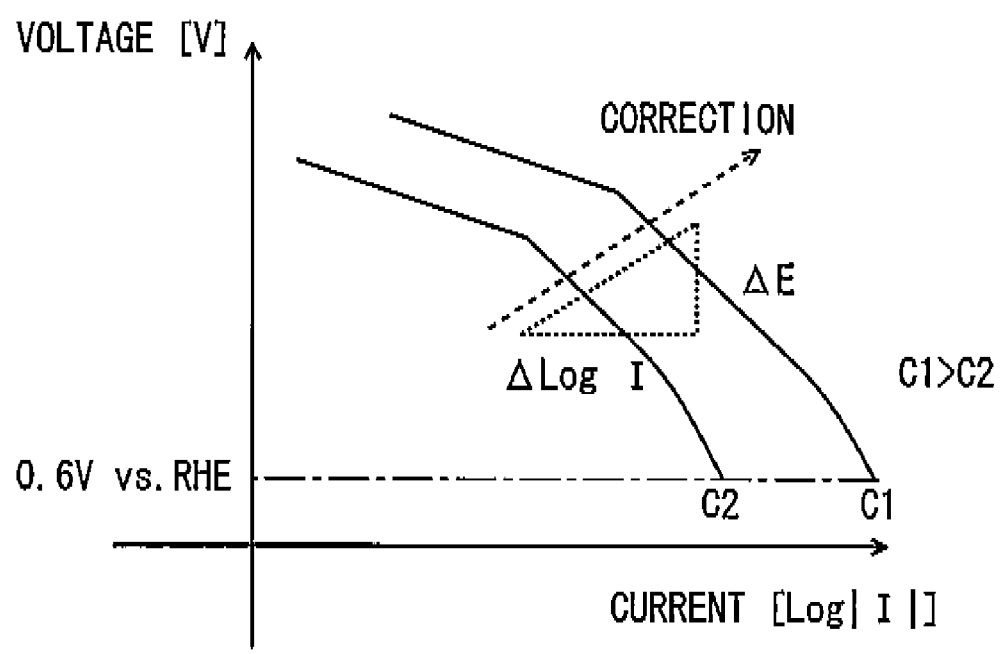
FIG. 12 is a graph showing a method for obtaining mobility coefficient $\alpha_C$.

FIG. 12 is a graph showing a method of calculating the mobility coefficient $\alpha_C$ by using Tafel plots in different oxygen concentrations (C1 and C2). It is generally known that equilibrium potential and exchange current change according to the gas concentration as represented by the expressions (2) and (3) when there is no influence of diffusion (when bulk concentration=electrode surface concentration).

$$\Delta(E) = \frac{2.3RT}{nF} \text{Log} \frac{C1}{C2} \quad (2)$$

$$\Delta(\text{Log}I) = \alpha_c \text{Log} \frac{C1}{C2} \quad (3)$$

R is a gas constant, T is a temperature, n is the number of reaction electrodes, F is the Faraday constant, and $\alpha$ is a mobility constant ($\alpha_c = 1 - \alpha_a$).

However, the Tafel slope does not vary according to the oxygen concentrations (C1, C2) because the reaction mechanism (oxidation-reduction reaction) does not change according to gas concentrations. From the expressions (2) and (3), shift (slope of change) of the Tafel plot caused by gas concentrations is calculated as represented by the expression (4).

$$\frac{\Delta(E)}{\Delta(\text{Log}I)} = \frac{2.3RT}{\alpha_c nF} \quad (4)$$

Therefore, slope correction is applied to the corrected Tafel plot at the oxygen concentration C2 by use of the expression (4) to obtain the corrected Tafel plot at the oxygen concentration C1 (FIG. 12). In the expression, $\alpha_C$ is a mobility coefficient. In most cases, 0.5 is generally used in calculation. Since $\alpha_C$, may often vary according to reaction or experimental conditions, it is however necessary to determine $\alpha_C$ optimized by use of the expression (3) so that the two plots are most fitted. In this case, corrected Tafel plots obtained at other concentrations (oxygen concentrations C3, C4 . . . ) than the oxygen concentrations C1 and C2 may be used to improve fitting accuracy of $\alpha_C$.

Then, in step S13, Tafel slopes b1 and b2 are calculated. Although various modifications of the procedure for this processing may be conceived, an example thereof will be described below.

Figure 13:
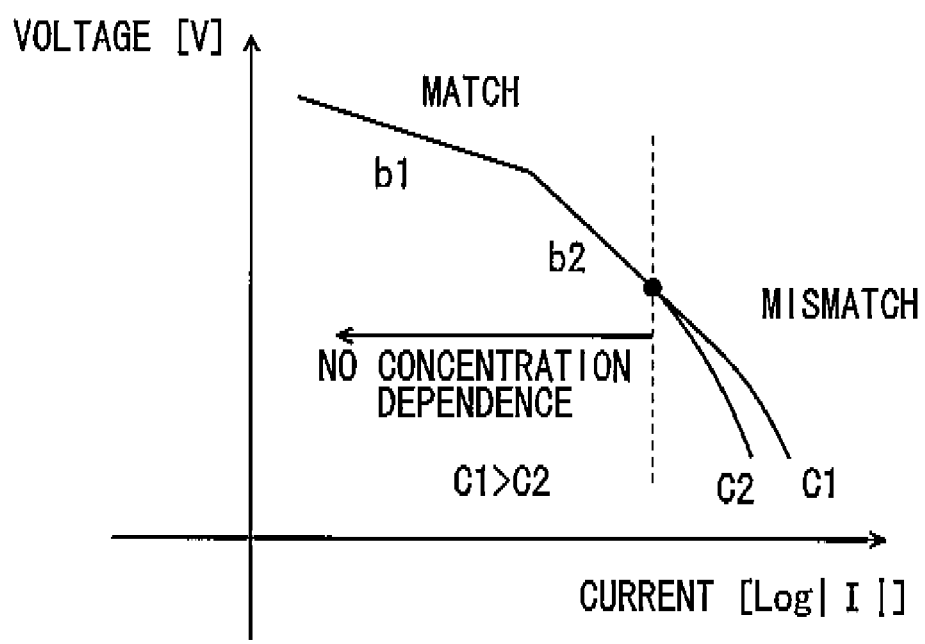
FIG. 13 is a graph showing the principle of a method for determining a concentration-independent region.

FIG. 13 is a graph showing the principle of the method for determining a concentration-independent region.

If only activation is observed without any influence of diffusion, the plots at the oxygen concentrations C1 and C2 should be made coincident by only movement based on the mobility coefficient $\alpha_C$ and good linearity should be exhibited on all the plot region. In practice, linearity is however surely collapsed by the influence of diffusion. Therefore, the introduced gas concentration is intentionally changed so that the steps S1 to S4 are executed while the gas diffusion coefficient is changed. Corrected Tafel plots corresponding to the gas diffusion coefficients are acquired so that the region where plots made coincident regardless of the change of the gas diffusion coefficient can be regarded as having no influence of diffusion. In the region with no influence of diffusion determined by this method, linear approximation is performed so that two Tafel slopes b1 and b2 caused by the activation overvoltage can be calculated properly.

For example, in the example shown in FIG. 13, when a specific current value is used as a threshold, plots are made well coincident in a region where the current I is small, but plots diverge in a region where the current I is large. Accordingly, in the former region, determination can be made that plots in FIG. 13 directly indicate the Tafel slopes b1 and b2. In this case, linear approximation may be performed in this region in the aforementioned manner.

However, when diffusion performance due to degradation is lowered, when the second Tafel slope b2 cannot be observed because the influence of diffusion appears early for the reason of too low gas concentration or when the matched region of the Tafel slope b2 is so small that correlation of linear approximation is low, the Tafel slope b2 cannot be calculated by linear approximation. In this case, it is however possible to use a Tafel correction equation in consideration of the influence of diffusion.

Figure 14:
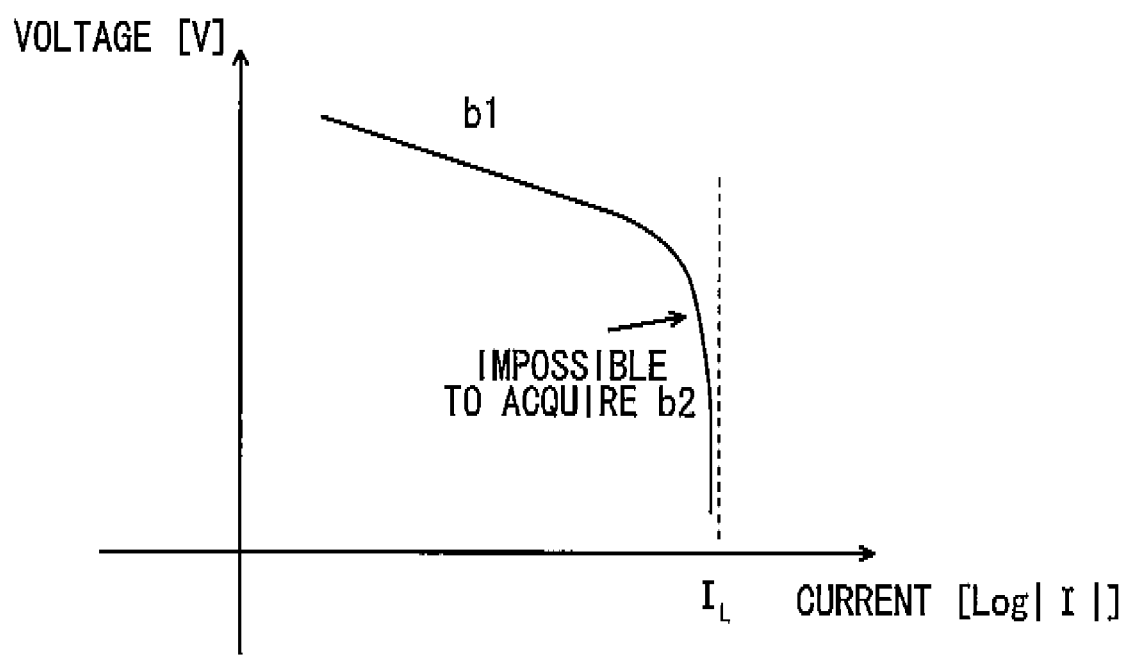
FIG. 14 is a graph showing an example in which the influence of diffusion appears in Tafel plots from a region of a relatively small current.

FIG. 14 is a graph showing an example in which the influence of diffusion appears in Tafel plots from a region where the current is relatively small. Here, the fact where the influence of diffusion appears early means the fact that limiting diffusion current ($I_L$) can be observed at a relatively small current load, as shown in FIG. 14. The Tafel correction equation in consideration of the influence of diffusion is given by the expression (5) in which the first term on the right side shows activation overvoltage ($\eta_{ct}$) and the second term on the right side shows concentration overvoltage ($\eta_c$).

$$\eta_{In} = b2 \cdot \text{Log}\left(\frac{I_n}{i_0}\right) + b2 \cdot \text{Log}\left(\frac{I_L}{I_L - I_n}\right) \quad (5)$$

$$\eta_{In} = b2 \cdot \text{Log}\left(\frac{I_n}{i_0}\right) + b2 \cdot \text{Log}\left(\frac{I_n}{I_L - I_n}\right) \quad (6)$$

Here, $i_0$ is an exchange current.

Figure 15:
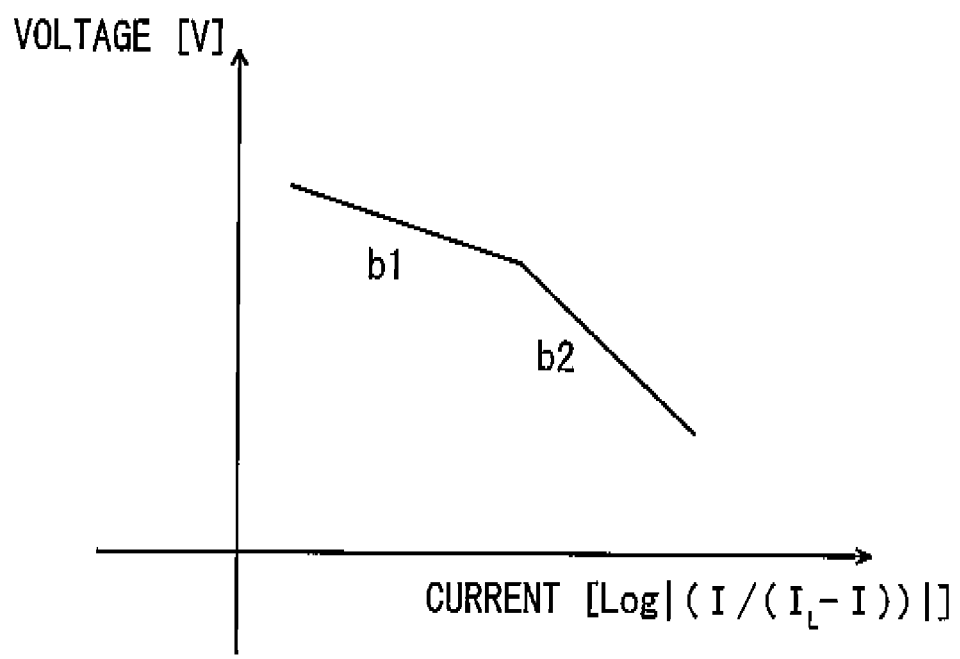
FIG. 15 is a graph showing plots in the case where the x axis of Tafel plots is changed to $\mathrm{Log}(I_n/I_L-I_n))$.

Therefore, plots shown in FIG. 15 are obtained in such a manner that the expression (5) is transformed into the expression (6) and the x axis of the Tafel plots is reset to $\text{Log}(I_n/(I_L-I_n))$. When plots shown in FIG. 14 are converted into plots shown in FIG. 15 in this manner, the Tafel slope can be expressed on graph in consideration of the influence of diffusion. By this correction, correlation of linear approximation can be improved so that the Tafel slope b2 can be calculated accurately.

In this manner, in the procedure of the steps S10 to S13, Tafel plots caused by gas concentrations are shifted and slope correction is applied based on theoretical equations to true up plots so that a region not affected by concentrations is extracted from a portion where plots are matched. Accordingly, when linear approximation is performed in the region, an appropriate Tafel slope can be obtained and the range of each of the regions b1 and b2 can be extracted correctly.

As described above, in accordance with the fuel cell evaluator according to the invention, because a standardizing process is applied after a process of removing impedance not caused by reaction resistance ($R_{ct}$) and extracting only reaction impedance, standardized impedance can be separated accurately in accordance with each reaction process.

Moreover, because reaction impedance changing sensitively to the current value can be expressed accurately and collectively for each of the regions b1 and b2 by the standardizing process, detailed evaluation can be performed as one characteristic value without having the influence of change of the measurement operating point.

Moreover, besides evaluation of the fuel cell, even in electrode reaction other than oxygen reduction reaction, for example, in the case where a porous electrode is used in a solution system, reaction resistance according to Tafel equations can be separated in accordance with a reaction process, expressed as a characteristic value (reaction impedance) having frequency information and evaluated.

Although the aforementioned embodiment has been described in an example in which Cole-Cole plots are used as characteristic indicated by the indicator 37, any method may be used for indicating characteristic. Moreover, corresponding measurement frequencies may be indicated in Cole-Cole plots. In addition, a frequency axis orthogonal to a plane on which Cole-Cole plots are drawn may be provided and plotting may be performed on a three-dimensional coordinate system so that the three values of measurement frequency, real part and imaginary part can be read.

The applicable scope of the invention is not limited to the aforementioned embodiment. The invention can be applied widely to a fuel cell evaluator which evaluates characteristic of a fuel cell based on frequency characteristic of impedance.

Embodiment 2

Figure 16:
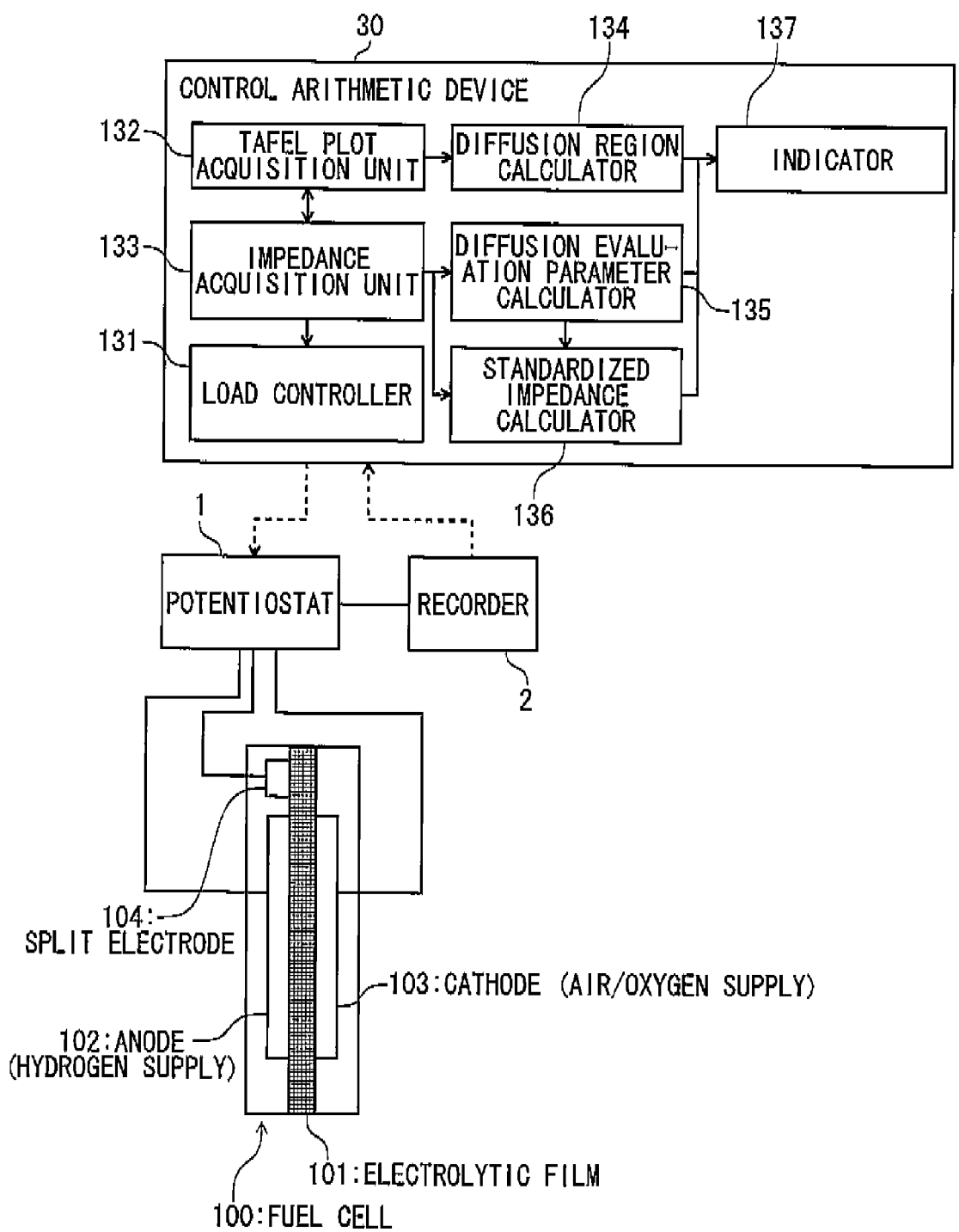
FIG. 16 is a block diagram showing a fuel cell measuring system.

FIG. 16 is a block diagram showing a fuel cell measuring system as a fuel cell evaluator according to Embodiment 2. Incidentally, in FIG. 16, parts the same as those in FIG. 1 are referred to by the same numerals correspondingly.

The fuel cell 100 shown in FIG. 16 is a single cell which has a structure in which an electrolytic film 101 having a surface modified with Pt/C catalyst is sandwiched between an anode 102 having a gas diffusion layer and a cathode 103 having a gas diffusion layer. A split electrode 104 split from the anode 102 is provided on a side of the anode 102. The anode 102 and the split electrode 104 are electrically insulated from each other.

At the time of measurement, hydrogen is supplied to the anode 102 and air or oxygen is supplied to the cathode 103 to make a power generation state. Electrochemical measurement is performed by a triode system. When cathode characteristic is evaluated, the cathode 103 is used as a working electrode while the anode 102 is used as a counter electrode. In addition, the anode-side separate split electrode 104 electrically insulated from the anode 102 and the cathode 103 is used as a reference electrode (RHE). As shown in FIG. 16, the anode 102, the cathode 103 and the split electrode 104 are connected to a potentiostat 1, so that respective results of measurement by the potentiostat 1 are transferred to a recorder 2.

As shown in FIG. 16, a control arithmetic device 30 is connected to the potentiostat 1 and the recorder 2. The control arithmetic device 30 executes control of the potentiostat 1, acquisition of the measurement results from the recorder 2 and arithmetic operation based on the acquired measurement results.

Hydrogen is supplied to the anode 102 of the fuel cell 100 while air or oxygen is supplied to the cathode 103. These supplied gases are given through a gas supply device (not shown). The gas supply device is connected to the control arithmetic device 30, so that the gas concentration, flow rate, temperature, etc. of each gas supplied to the fuel cell 100 are controlled by the control arithmetic device 30 through the gas supply device.

As shown in FIG. 16, the control arithmetic device 30 has: a load controller 131 which controls the potentiostat 1; a Tafel plot acquisition unit 132 which acquires Tafel plots by changing the current value of the fuel cell 100 under a constant amount of supplied gas; an impedance acquisition unit 133 which acquires impedance of the fuel cell 100 based on measurement data (voltage value and current value) acquired by superposing an alternating current on a current of each current value; a diffusion region calculator 134 for extraction of a diffusion region which will be described later;

a diffusion evaluation parameter calculator 135 which calculates diffusion evaluation parameters (which will be described later) based on the impedance acquired by the impedance acquisition unit 133; a standardized impedance calculator 136 for calculating standardized impedance which will be described later; and an indicator 137 for presenting a result of calculation in each portion.

Either voltage regulation or current regulation may be used for load control using the potentiostat 1. The voltage regulation or current regulation is controlled according to a condition designated by the load controller 131 so that measured data (voltage value/current value) are recorded by the recorder 2. Tafel plots are acquired by the Tafel plot acquisition unit 132, a diffusion region is calculated by the diffusion region calculator 134. Impedance is acquired by the impedance acquisition unit 133. Diffusion evaluation parameters are calculate by the diffusion evaluation parameter calculator 135, and standardized impedance after correction of a diffusion term is calculated by the standardized impedance calculator 136. Results of calculation by the diffusion region calculator 134, the diffusion evaluation parameter calculator 135 and the standardized impedance calculator 136 are presented on a monitor or the like by the indicator 137. Besides raw data (voltage value/current value), results of calculation etc. by the diffusion region calculator 134, the diffusion evaluation parameter calculator 135 and the standardized impedance calculator 136 may be stored in the recorder 2.

Figure 17:
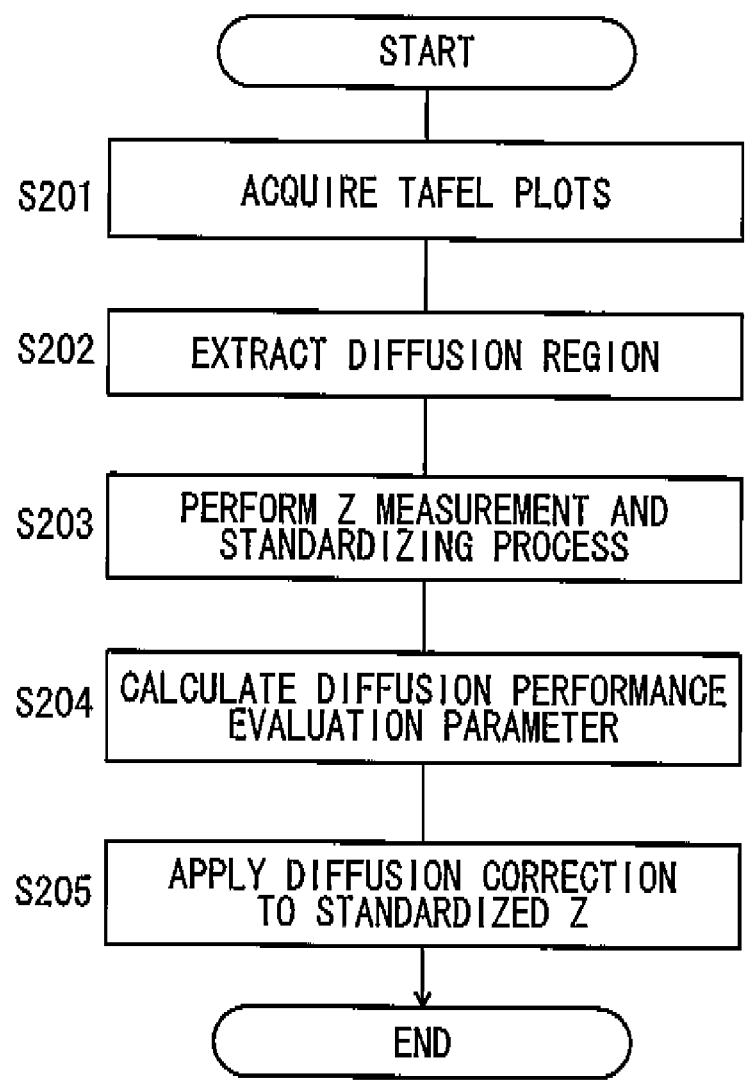
FIG. 17 is a flow chart showing operation of the measuring system.

FIG. 17 is a flow chart showing operation of the measuring system. FIGS. 18 to 25 are views showing examples of display on the indicator 137.

In step S201 in FIG. 17, IV characteristic is measured based on voltage sweep or current sweep, so that Tafel plots expressing the relation between the logarithm of current and voltage are acquired. The processing is equivalent to the function of the Tafel plot acquisition unit 32.

Figure 18:
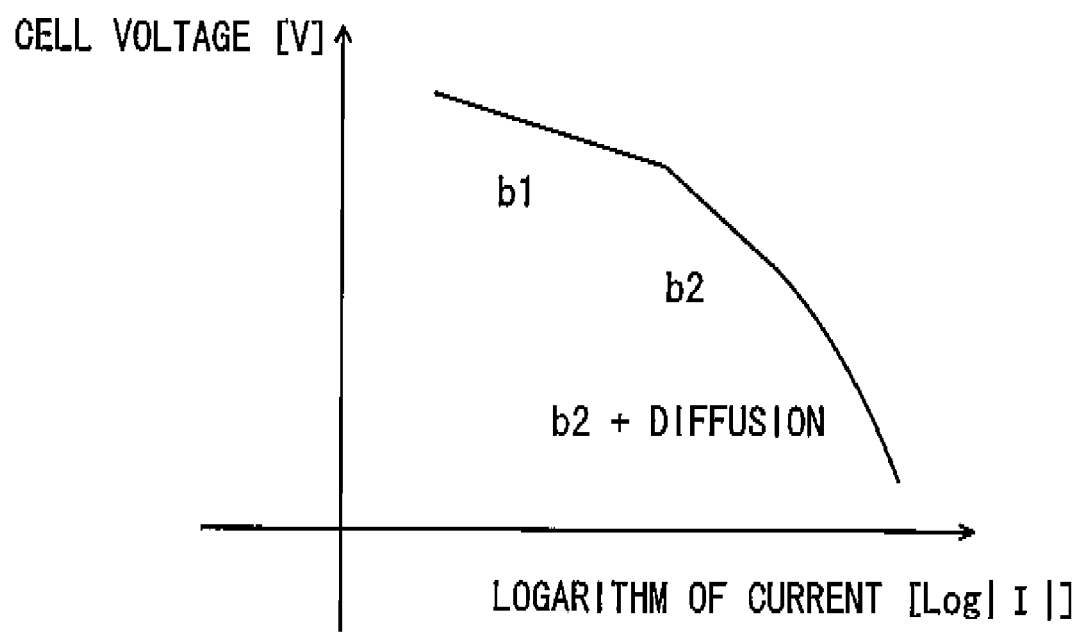
FIG. 18 is a graph showing Tafel plots measured up to a diffusion region.

FIG. 18 is a graph showing Tafel plots measured up to a diffusion region.

As shown in FIG. 18, it is generally known that two Tafel slopes (b1 and b2) are present in oxygen reduction reaction. There is no linear region in the diffusion region, so that the slope changes as the current increases.

An electrode reaction equation in consideration of diffusion of reactant will be described here. When polarization is so sufficiently large that a counterreaction current can be ignored, current i and overvoltage η can be expressed as shown in equations eq.11 and eq.12.

$$\eta = -\frac{2.3RT}{\alpha nF}\log\frac{i_L}{i_0} - \frac{2.3RT}{\alpha nF}\log\left(\frac{i}{i_L - i}\right) \quad \text{eq. 11}$$

$$i = i_0\left(1 - \frac{i}{i_L}\right)\exp\left(-\frac{\alpha nF}{RT}\eta\right) = k - \frac{2.3RT}{\alpha nF}\log\left(\frac{i}{i_L - i}\right) \quad k = const \quad \text{eq. 12}$$

Moreover, the equation eq.12 is transformed as follows to obtain an equation eq.13, $$i\frac{d\eta}{di} = iZ = -i \cdot \frac{2.3RT}{\alpha nF}\left\{\frac{i_L - i}{i} \cdot \frac{d}{di}\left(\frac{i}{i_L - i}\right)\right\} = -\frac{2.3}{\alpha nF}\frac{i_L}{i_L - i} \approx$$

$$-\left[\frac{2.3RT}{\alpha nF} + \frac{2.3RT}{\alpha nFi_L} \cdot i\right] \text{ (when } i_L \text{ is sufficiently large)} \quad \text{eq. 13}$$

As described above, the left side of the equation eq.13 is a value which is obtained by multiplying impedance (dη/di) and current value i and which is equivalent to Tafel slope. An operation of multiplying impedance and current value is called standardizing process in this specification.

When limiting diffusion current $i_L$ is sufficiently larger than measurement current i, approximation as shown in the equation eq.13 can be made. It is apparent from this equation that a term proportional to the current caused by diffusion is added to a Tafel slope (2.3RT/αnF) of reaction in a region affected by diffusion.

The relation between impedance and the measurement current value at the time of measuring the impedance will be described here.

In a region not particularly affected by diffusion (concentration-independent region), the current I and the voltage E have a relation of the Tafel equation (11). In the equation (11), b is a Tafel slope. On the other hand, at the time of measuring impedance, impedance is calculated by the equation (12) on the assumption that response of an output voltage to AC modulation of an input current has a linear relation.

$$E = a + b \times \log I \quad (11)$$

$$Z = \frac{dE}{eI} \quad (12)$$

From the equation (11), the relation of an equation (13) is obtained in the concentration-independent region.

$$\frac{dE}{dI} = b \cdot \frac{1}{I} \quad (13)$$

Accordingly, in the concentration-independent region, the product I·Z of impedance Z and measurement current value I has a constant value.

This relation has been mentioned, for example, in the article entitled "*Analysis of Relationship between Current Distribution and Impedance in Porous Electrode*", Shigenori Mitsushima, Nobuyuki Kamiya and Ken-ichiro Ota, Electrochemistry, P. 810-814, 2006. In the literature, there is a description that the deformation of the I-Z arc due to frequency change is used for considering the ratio of ion resistance to electron resistance.

Then, in step S202, a diffusion region is extracted. This processing is equivalent to the function of the diffusion region calculator 34.

Here, a value (slope of Tafel plots) obtained by differentiating Tafel plots shown in FIG. 18 with respect to each measuring point is calculated first.

Figure 19A:
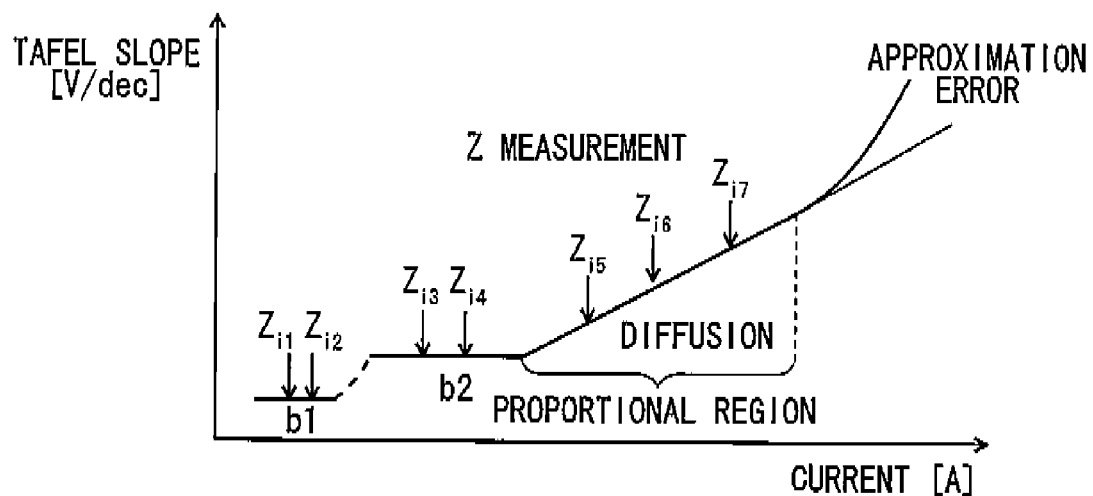

FIG. 19A is a graph showing (current-Tafel slope) characteristic when Tafel plots shown in FIG. 18 are differentiated with respect to each measuring point and the absolute value of a result of the differentiation is defined as a Tafel slope. A linear region on Tafel plots is expressed here as a plateau region. Two plateaus showing regions b1 and b2 can be confirmed. Moreover, as represented by the equation eq.13, in a region (exceeding b2) affected by diffusion, a term proportional to the current is added to the Tafel slope to form a proportional region. However, because the equation eq.13 is an approximate expression which is established when the limiting current $i_L$ is sufficiently larger than the measurement current i, the proportional region is widened as the concentration of reactant (oxygen) becomes high and the rate of utilization becomes low.

Figure 19B:
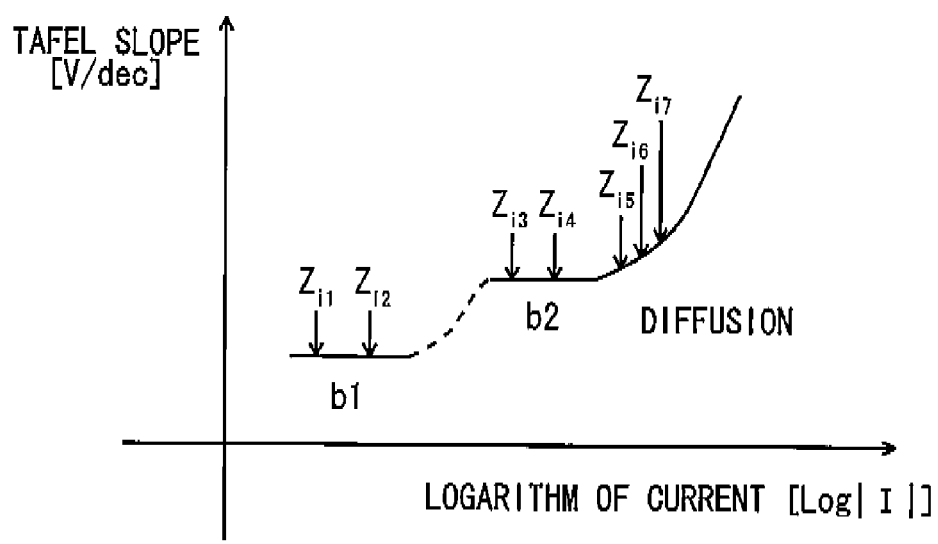

FIG. 19B is a graph showing the same characteristic as in the graph of FIG. 19A expressed as (logarithm of current-Tafel slope) characteristic. In FIG. 19A, the region b1 appealing as a small current region may be hidden on graph because measurement current values are displayed on a linear axis. In this case, when measurement current values are expressed on a logarithmic axis as shown in FIG. 19B, the region b1 can be determined easily so that, for example, the measurement operating point of impedance can be determined exactly.

Figure 20:
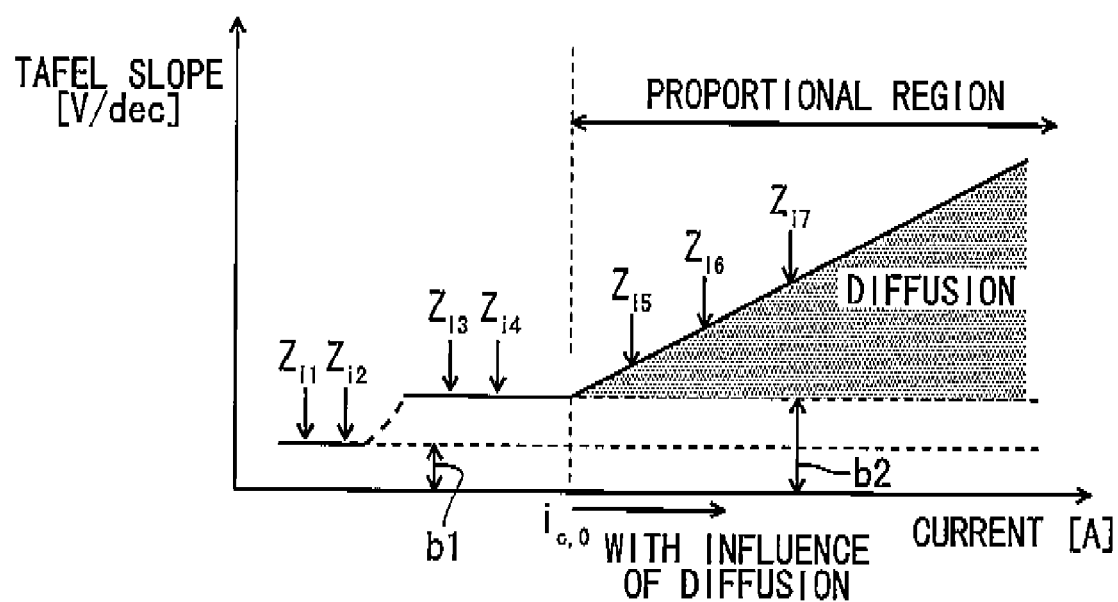
FIG. 20 is a graph showing current-Tafel slope characteristic in the case where the influence of diffusion appears from the region b2.

FIG. 20 is a graph showing (current-Tafel characteristic) in the case where the region b2 is affected by diffusion. By searching for the proportional region shown in FIG. 20, a diffusion term can be obtained. The current starting the influence of diffusion is defined here as $i_{c,0}$. In FIG. 20, a portion corresponding to the diffusion term in the proportional region is hatched. The same rule applies to FIG. 21 which will be described later.

As shown in FIG. 20, the Tafel slope takes a value obtained by adding a diffusion term proportional to the current to the Tafel slope corresponding to the region b2 with the current $i_{c,0}$ as a boundary.

Figure 21:
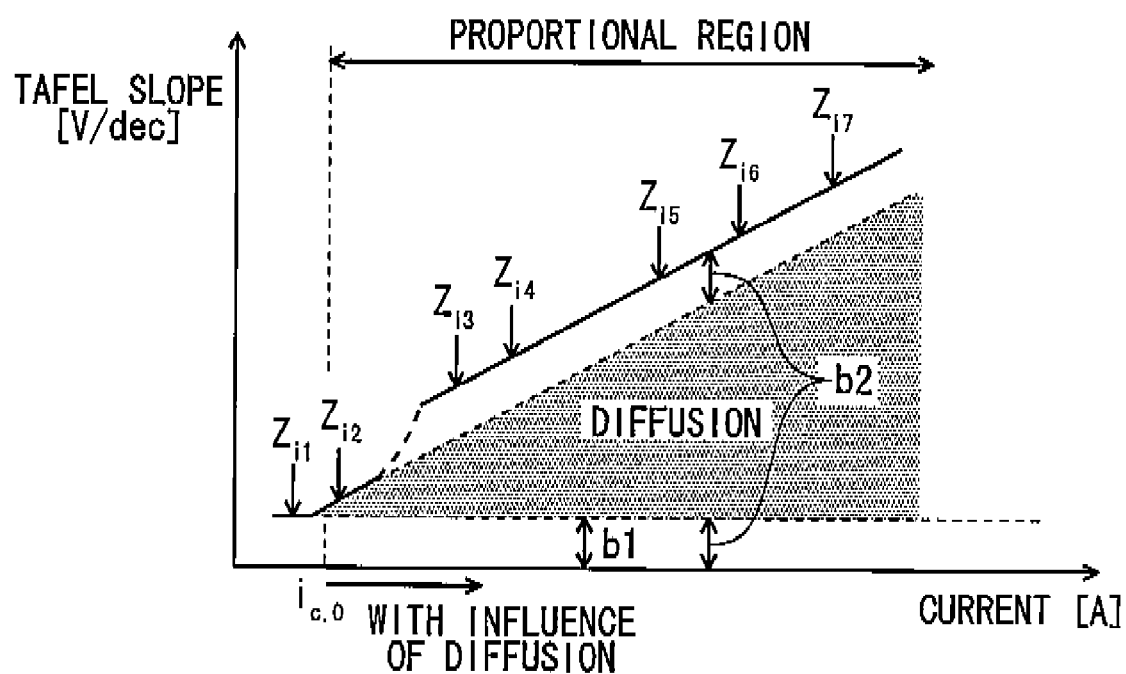
FIG. 21 is a graph showing current-Tafel slope characteristic in the case where the influence of diffusion appears from the region b1.

FIG. 21 is a graph showing (current-Tafel characteristic) in the case where the region b1 is affected by diffusion. Also in this case, the diffusion term can be obtained by searching for the proportional region hatched. As shown in FIG. 21, Tafel slopes take values obtained by adding diffusion terms proportional to the currents to the Tafel slope corresponding to the region b1 and the Tafel slope corresponding to the region b2, respectively, with the current $i_{c,0}$ as a boundary. The slope of a line generated by each diffusion term is constant in all regions.

Figure 22:
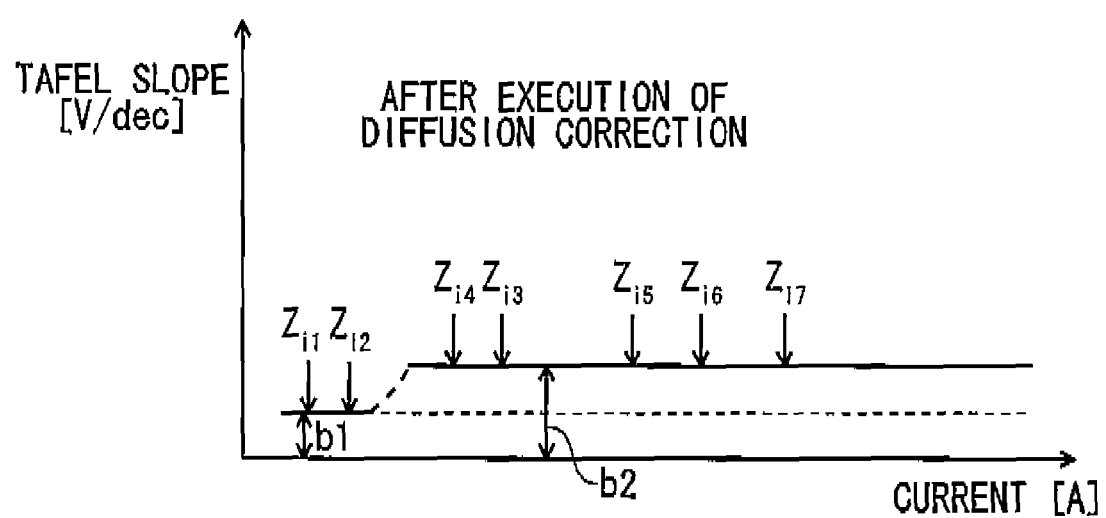
FIG. 22 is a graph showing current-Tafel slope characteristic after diffusion correction.

FIG. 22 is a graph showing (current-Tafel slope) characteristic after diffusion correction. By diffusion correction, diffusion terms (hatched portions) shown in FIGS. 20 and 21 are removed so that only plateaus showing the regions b1 and b2 appear. Incidentally, diffusion correction is equivalent to processing in step S205 which will be described later.

Then, in step S203, impedance measurement and standardization processing of the measured impedance are performed. This processing is equivalent to the function of the standardized impedance calculator 136.

Figure 23:
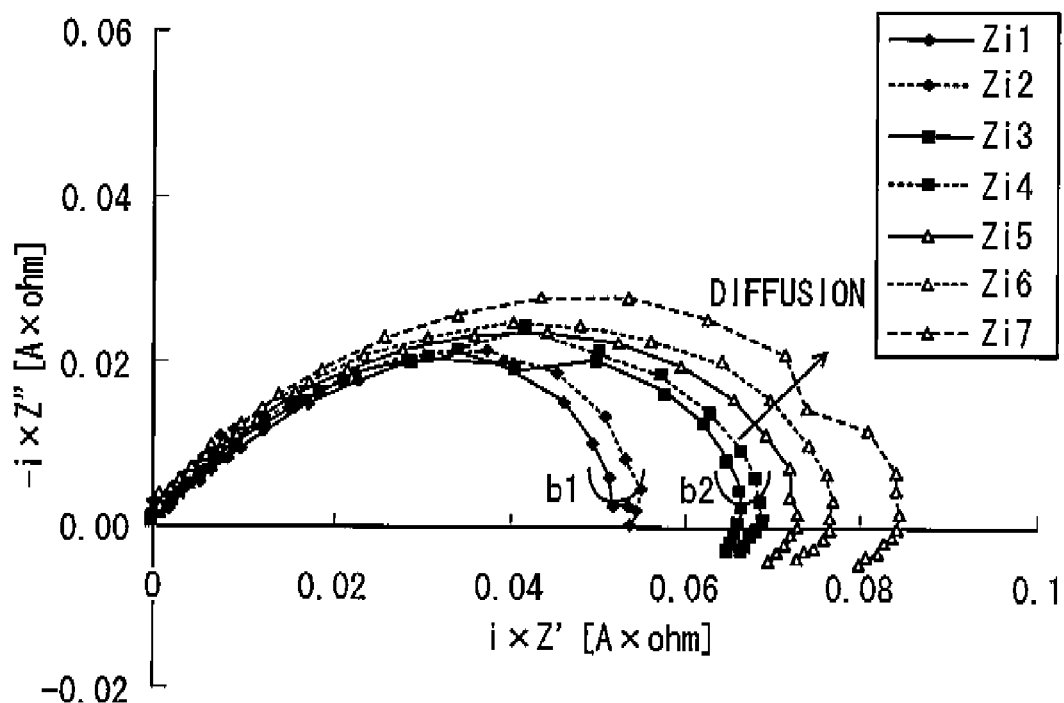
FIG. 23 is a graph showing standardized impedance measured at each operating point.

FIG. 23 is a graph showing standardized impedance Zi1 to Zi7 measured at respective operating points i1 to i7. In FIGS. 19 to 22, operating points at which standardized impedance values Zi1 to Zi7 are measured respectively are represented by the arrow (↓) In FIGS. 19 and 20, standardized impedance values Zi1 and Zi2 correspond to the region b1, standardized impedance values Zi3 and Zi4 correspond to the region b2, and standardized impedance values Zi5 to Zi7 correspond to the region b2 and the diffusion region. In FIG. 21, a standardized impedance value Zi1 corresponds to the region b1, a standardized impedance value Zi2 corresponds to the region b1 and the diffusion region, and standardized impedance values Zi3 to Zi7 correspond to the region b2 and the diffusion region.

Incidentally, FIG. 23 shows the case (corresponding to FIGS. 19 and 20) where diffusion appears from the middle of the region b2.

As shown in FIG. 23, impedance values belonging to the region b1 and impedance values belonging to the region b2 are collected to common curve groups respectively by standardization. It is apparent that standardized impedance increases as the current at the operating point increases when the influence of diffusion is added. That is, the curve is moved to a position far from the curve group of the region b2 by the influence of diffusion.

Then, in step S204, a diffusion performance evaluation parameter ($C_{(f)}$) is calculated. This processing is equivalent to the function of the diffusion evaluation parameter calculator 135.

A method of calculating the diffusion performance evaluation parameter ($C_{(f)}$) will be described here. A calculation equation of evaluation parameter in standardized impedance is given by the equation eq.14.

$$C_{(f)} = \frac{(iZ_{(f)})_{c,n} - ((iZ_{(f)})_{c,m})}{i_n - i_m} \qquad \text{eq. 14}$$

Here, n and m are operating points of the diffusion region ($i_n > i_m$).

In this equation, the difference between standardized impedance values ($iZ_{(f)}$) at two points of the diffusion region is divided by the difference between current values at the respective operating points. Accordingly, this equation is equivalent to calculation of the slope of a line in the proportional region shown in FIG. 20 or 21. That is, the resulting value can be extracted as an evaluation parameter value independent of the current.

Figure 24:
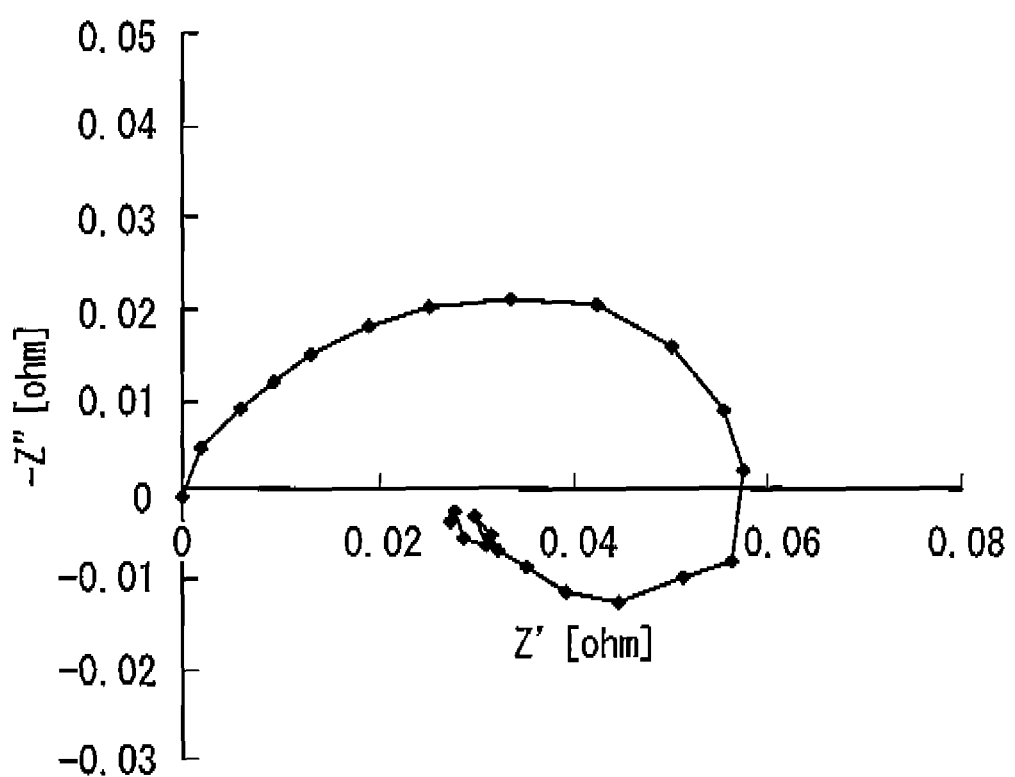
FIG. 24 is a graph illustrating a diffusion performance evaluation parameter calculated.

FIG. 24 is a graph illustrating the calculated diffusion performance evaluation parameter. When evaluation parameter having frequency information caused by only diffusion is obtained in this manner, diffusion performance can be discussed based on a wide view point. Moreover, impedance at an operating point not measured actually can be estimated by use of the diffusion performance evaluation parameter. Such processing is equivalent to the function of the estimation unit.

Then, in step S205, the diffusion term is corrected based on the diffusion performance evaluation parameter. This processing is equivalent to the function of the standardized impedance calculator 136.

The equation eq.15 is a correction equation showing a method of correcting the diffusion term based on the diffusion performance evaluation parameter.

$$(iZ_{(f)})_{c,x}' = (iZ_{(f)})_{c,x} - C_{(f)} \cdot (i_x - i_{c,0}) \qquad \text{eq.15}$$

Here, x is any operating point in the diffusion region.

This equation performs correction by which a value obtained by multiplying the difference between the current value ($i_x$) at the measurement operating point and the current value ($i_{c,0}$) starting the influence of diffusion by the evaluation parameter ($C_{(f)}$) is subtracted from the original standardized impedance ($(iZ_{(f)})_{c,x}$).

That is, when a diffusion term at any operating point of the diffusion region is obtained and used for subtraction, the original standardized impedance is corrected.

Figure 25:
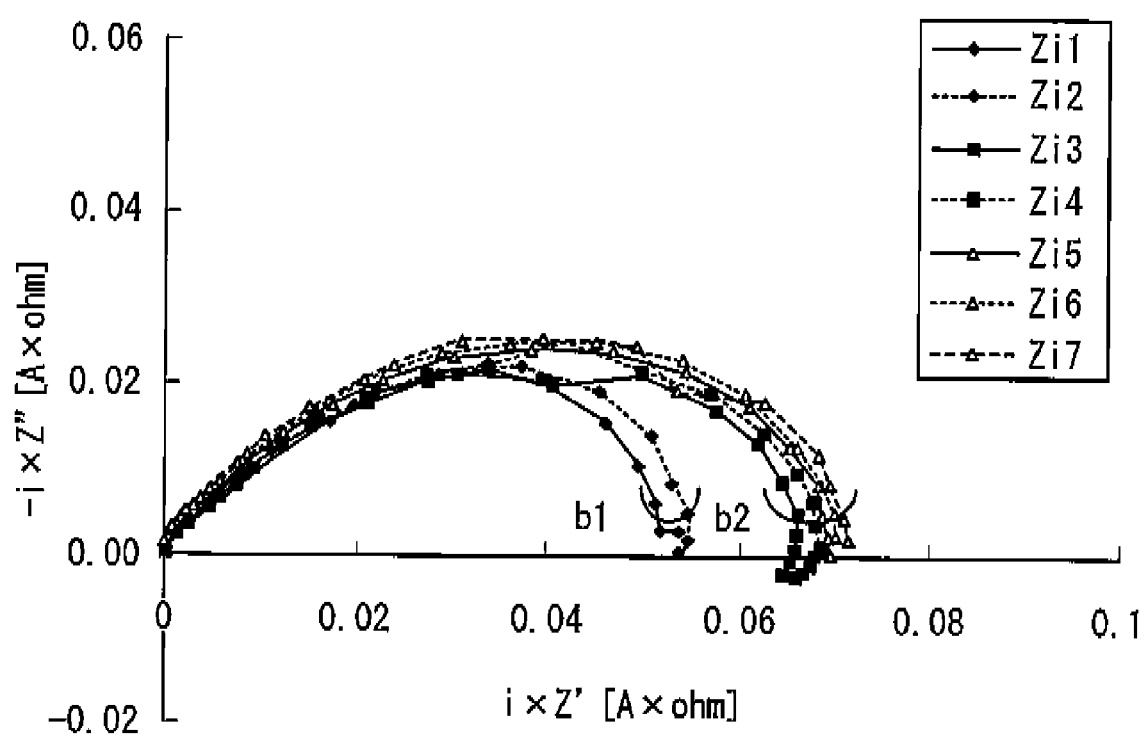
FIG. 25 is a graph showing standardized impedance after diffusion correction.

FIG. 25 is a graph showing standardized impedance after correction of diffusion. It is apparent from comparison with FIG. 23 that the influence of the diffusion term is removed by the aforementioned method and the curve group indicating the measurement result in the diffusion region is moved to a position indicating standardized impedance of the region b2. Accordingly, even when the diffusion performance is so poor that the region b2 is narrow or when the region b2 cannot be seen, standardized impedance of the region b2 can be calculated and evaluated exactly.

Moreover, because $C_{(f)}$ in the equation eq.14 and the coefficient of $-i$ in the second term in the right side of the equation eq.13 are equivalent to each other (corresponding to the slope of the linear region), eq.16 can be given. When eq.16 is transformed into eq.17, the limiting diffusion current ($i_L$) can be estimated as a characteristic value ($i_{L(f)}$) having frequency information $$C_{(f)} = \frac{2.3RT}{\alpha nF} \cdot \frac{1}{i_L} \qquad \text{eq. 16}$$

$$i_{L(f)} = \frac{2.3RT}{\alpha nF} \cdot \frac{1}{C_{(f)}} \qquad \text{eq. 17}$$

As described above, in accordance with the fuel cell evaluator according to this embodiment, when the differential value (Tafel slope) of Tafel plots is expressed as (current-Tafel slope) characteristic and plateau and current-proportional regions are searched, the region b1, the region b2 and the diffusion region can be separated from one another simply and the diffusion influence start current can be calculated.

When a diffusion performance evaluation parameter having frequency information independent of the current is calculated, diffusion performance which has been heretofore hardly evaluated can be discussed from a wide view point. Moreover, because the limiting diffusion current can be estimated as a characteristic value having frequency information, there is a possibility that the limiting diffusion current can be used effectively as new information at the time of optimum operation control.

Moreover, because diffusion correction of standardized impedance can be performed based on the diffusion performance evaluation parameter, standardized impedance can be separated in accordance with each reaction process (region) even in electrode reaction in which diffusion performance is so poor that the region b2 is small or the region b2 cannot be seen.

In addition, because calculation of the diffusion performance evaluation parameter and diffusion correction of the standardized impedance can be performed in electrode reaction in which reaction according to the Tafel equation is mixed with the influence of diffusion, the invention can be applied widely not only to evaluation of the fuel cell but also to electrode reaction other than oxygen reduction reaction in a solution system or the like.

The applicable scope of the invention is not limited to the aforementioned embodiment. The invention can be applied widely to a fuel cell evaluator which evaluates characteristic of the fuel cell based on electrochemical characteristic.

Embodiment 3

Figure 26A:
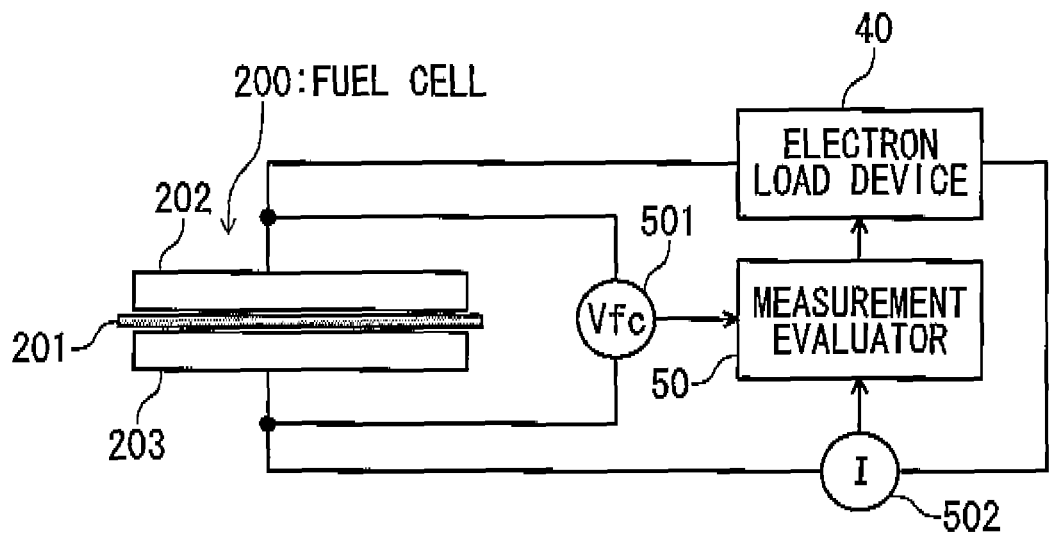
Figure 26B:
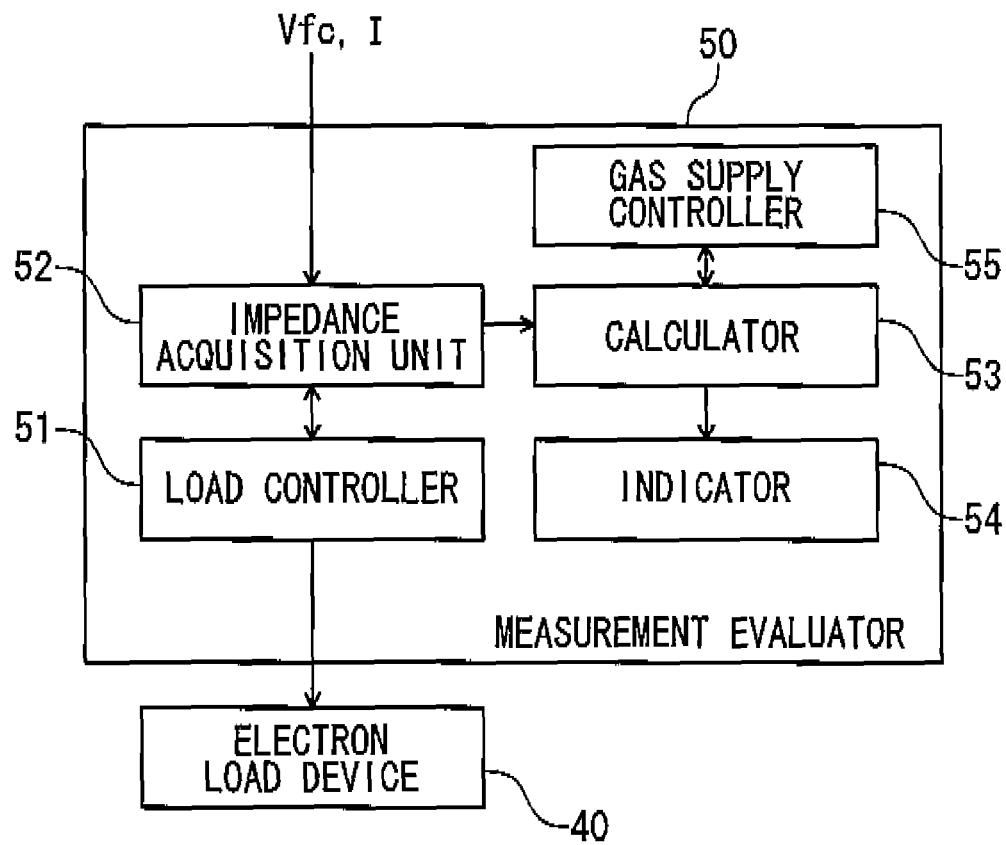

FIGS. 26A and 26B are diagrams showing a fuel cell (assembly cell) evaluator. FIG. 26A is a diagram showing a section of the fuel cell at the time of measuring characteristic of the fuel cell and a connection method at the measuring time. FIG. 26B is a block diagram functionally showing the configuration of a measurement evaluator.

As shown in FIG. 26A, a fuel cell 200 has: an electrolytic film 201 having a surface modified with Pt/C catalyst; a cathode 202 electrically insulated from the electrolytic film 201; and an anode 203 electrically insulated from the electrolytic film 201 like the cathode 202 and disposed counter to the cathode 202 with respect to the electrolytic film 201.

The cathode 202 is formed in such a manner that a catalyst layer, a diffusion layer and a separator (not shown) are laminated successively in outward order from the side of the electrolytic film 201. Similarly, the anode 203 is formed in such a manner that a catalyst layer, a diffusion layer and a separator (not shown) are laminated successively in outward order from the side of the electrolytic film 201. A gas flow path for supplying fuel gas is formed in each of the separators which are constituent members of the cathode 202 and the anode 203 respectively.

A voltage measuring module 501 for measuring a voltage (fuel cell voltage Vfc) between the cathode 202 and the anode 203 and a current measuring module 502 for measuring a current (load current) flowing in an electron load device 40 are connected to a load circuit of the fuel cell 200.

As shown in FIGS. 26A and 26B, the measurement evaluator 50 has: a load controller 51 which controls the current value of the electron load device 40 connected between the cathode 202 and the anode 203; an impedance acquisition unit 52 which acquires the impedance of the fuel cell 200 while changing the current value; a calculator 53 which calculates standardized impedance Z ($i[A/cm^2] \times z'$ [ohm])) which is the product of the impedance z' [ohm] acquired by the impedance acquisition unit 52 and current density ($i[A/cm^2]$) at the time of acquisition of the impedance; an indicator 54 such as a monitor which presents the value of standardized impedance Z calculated by the calculator 53 in the form of a graph with respect to the logarithm (logi) of the current density at the time of acquisition of the impedance; and a gas supply controller 55 which controls fuel gas supplied to the fuel cell 200 when the impedance z' is acquired.

A procedure for measuring standardized impedance will be described next.

The load controller 51 of the measurement evaluator 50 sets the frequency, DC current value and superposed AC amplitude for impedance measurement in the electron load device 40 and controls the current load on the cell. The waveform of the fuel cell voltage Vfc for a current load on which an AC component is superposed is measured by the voltage measuring module 501, and impedance z' [ohm] based on the gain and phase of the AC component of the voltage (fuel cell voltage Vfc) for the AC load is obtained by the impedance acquisition unit 52.

Then, the calculator 53 calculates (measures) standardized impedance Z ($i[A/cm^2] \times z'[ohm]$)) by integrating current density ($i[A/cm^2]$) acquiring impedance for the obtained impedance z' [ohm].

Figure 27A:
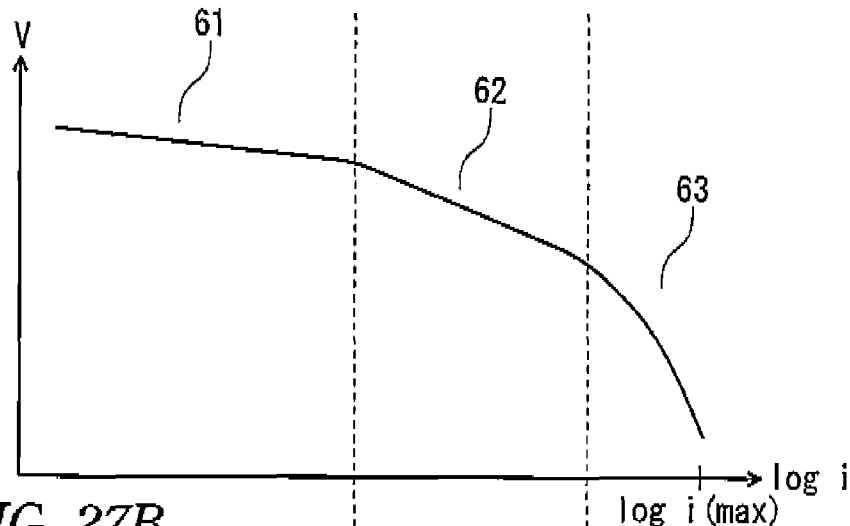
Figure 27B:
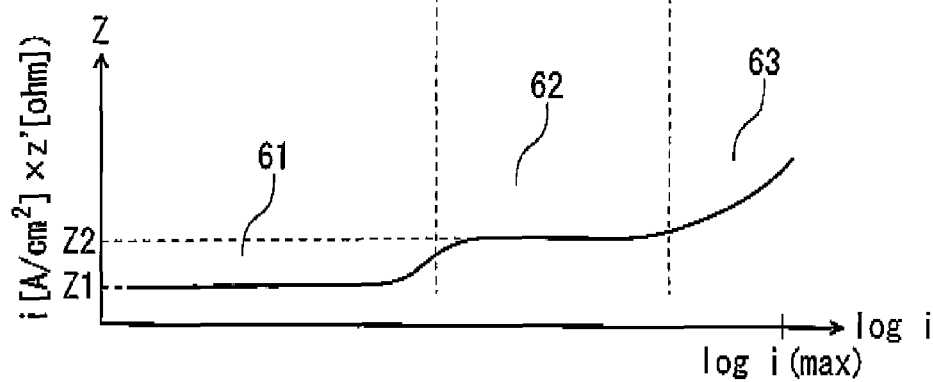

FIG. 27A is a graph illustrating voltage-current characteristic of the fuel cell 200. FIG. 27B is a graph illustrating standardized impedance Z-current characteristic of the fuel cell 200. Here, the horizontal axis showing current is set as the logarithm (logi) of current density. The measurement evaluator 50 calculates standardized impedance Z by measuring impedance at each current value while increasing the load current value gradually by the load controller 51. On this occasion, the fuel cell 200 goes into a stable power generation state with the elapse of time.

When the fuel cell 200 goes into a stable power generation state, a first Tafel region 61 and a second Tafel region 62 which are regions (concentration-independent regions) not affected by diffusion and a diffusion region (concentration-dependent region) 63 affected by diffusion can be confirmed. As shown in FIG. 27B, in the graph showing standardized impedance Z-current characteristic, the first Tafel region 61 and the second Tafel region 62 can be recognized as regions taking constant standardized impedance values Z1 and Z2 respectively and can be confirmed visually easily.

In the example shown in FIG. 27B, standardized impedance Z1 can be confirmed in the first Tafel region 61 and standardized impedance Z2 can be confirmed in the second Tafel region 62. That is, if standardized impedance Z1 and standardized impedance Z2 can be confirmed in standardized impedance Z-current characteristic, determination can be made that the fuel cell 200 goes into a stable power generation state. It can be known that characteristic (voltage-current characteristic shown in FIG. 27A in this case) of the fuel cell can be measured reproducibly.

Figure 27C:
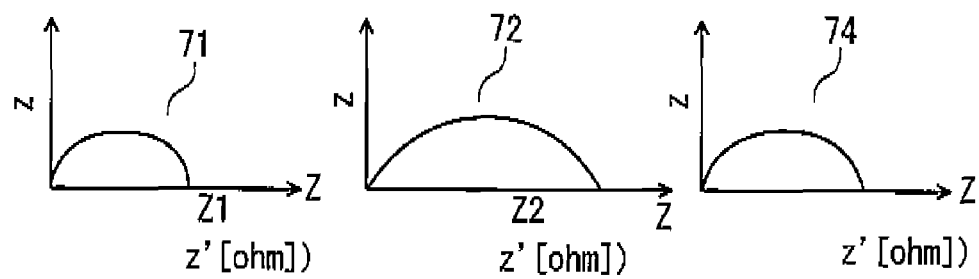

FIG. 27C is a graph showing Cole-Cole plots of standardized impedance Z in the first Tafel region 61 and the second Tafel region 62. The Cole-Cole plot 71 shown in FIG. 27C is a Cole-Cle plot in the first Tafel region 61. The Cole-Cole plot 72 shown in FIG. 27C is a Cole-Cle plot in the second Tafel region 62. The coordinate of an intercept on the real part axis in the Cole-Cole plot 71 and the coordinate of an intercept on the real part axis in the Cole-Cole plot 72 correspond to standardized impedance values Z1 and Z2 respectively. Moreover, the reaction arc appearing in each Cole-Cole plot takes a constant shape in each of the first and second Tafel regions 61 and 62 by standardization of impedance. In a transition region between the first and second Tafel regions 61 and 62, the shape of the reaction arc is provided as an intermediate shape between the two as represented by the Cole-Cole plot 74 in FIG. 27C.

Such Cole-Cole plots are calculated by the calculator 53 based on wide frequency range measured values obtained through the impedance acquisition unit 52. However, in this embodiment, the procedure for impedance measurement can be simplified so that the measurement frequency may be limited within a range where regions taking standardized impedance values Z1 and Z2 can be discriminated. For example, impedance measurement may be performed by an already established frequency or by already established frequencies.

Figure 28:
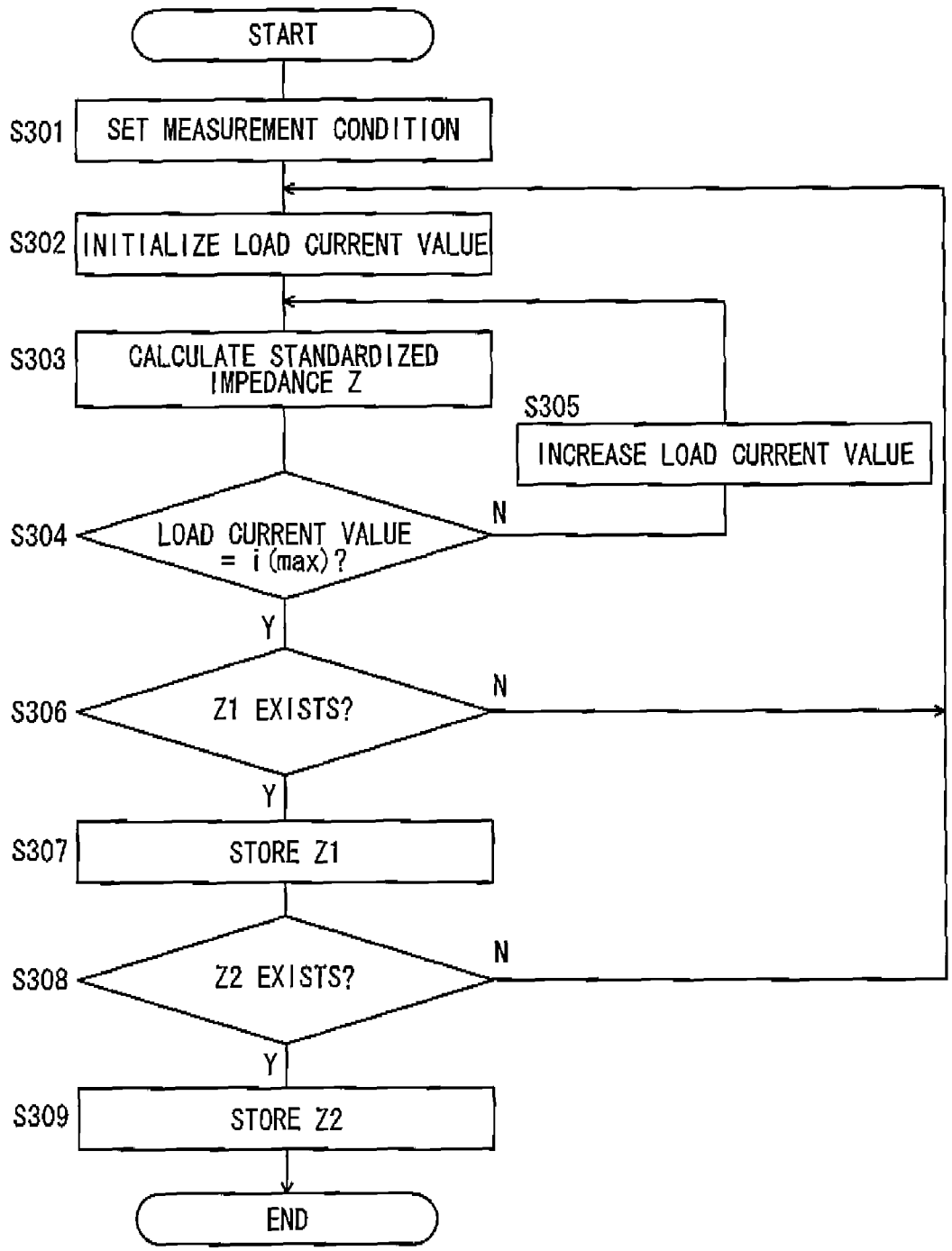
FIG. 28 is a flow chart showing operation of a measurement evaluator.
Figure 30:
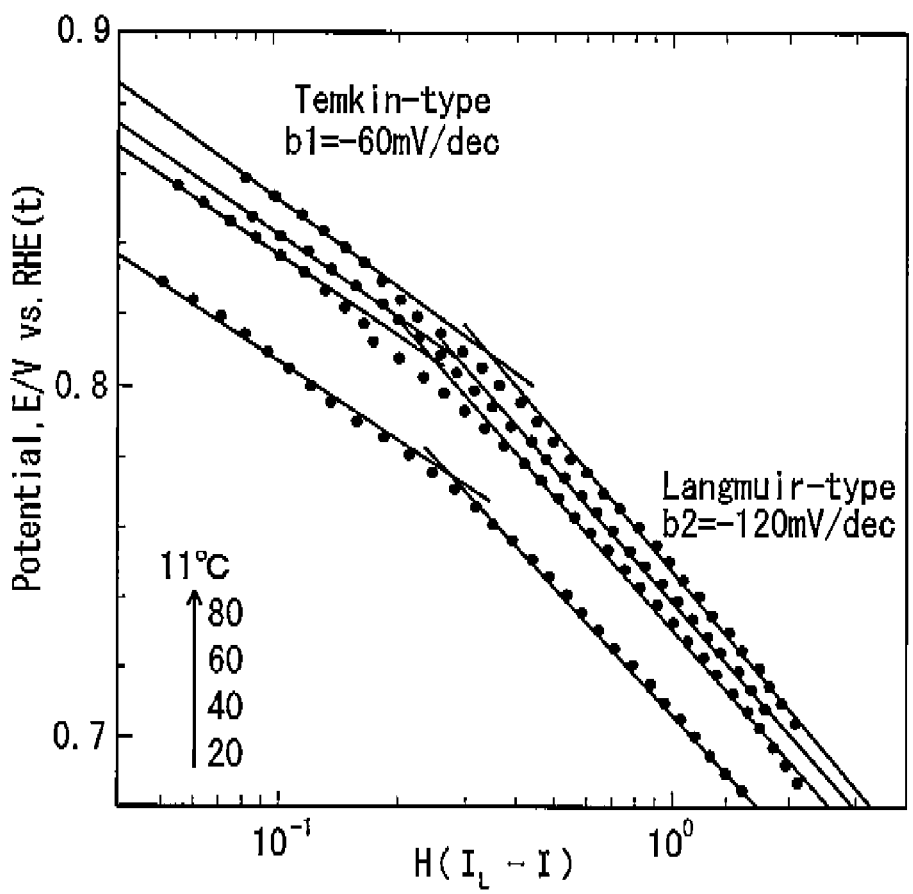
FIG. 30 is a graph showing Tafel slopes.

FIG. 28 is a flow chart showing operation of the measurement evaluator 50.

The measurement evaluator 50 calculates standardized impedance Z by measuring impedance while increasing the load current value and measuring current-voltage characteristic of the fuel cell 200.

First, the measuring condition is set (step S301). For example, the load controller 51 sets the range of the load current value on the electron load device 40, and the impedance acquisition unit 52 measures the value of film resistance. Accordingly, the film resistance value can be removed from impedance to be measured.

Then, the load controller 51 sets the load current value of the electron load device 4 to the initial value ($I_L$) of the load current value set in the step S301 (step S302). Successively, the impedance acquisition unit 52 measures impedance of the fuel cell 200 and the calculator 53 calculates standardized impedance Z (step S303). The calculated standardized impedance Z is plotted as standardized impedance Z-current characteristic.

Then, determination is made as to whether the load current value has reached the maximum value (i(max)) in the load current value range determined in the step S301 or not (step S304). When the step S304 results in affirmative determination, processing goes to step S306. When the step S304 results in negative determination, processing goes to step S305.

In step S305, the load controller 51 increases the load current value of the electron load device 40 by a predetermined value and processing goes back to the step S303.

On the other hand, in step S306, the calculator 53 determines, based on the standardized impedance Z calculated in the step S303, whether there is standardized impedance Z1 or not.

When determination in the step S306 results in that there is no standardized impedance Z1 (step S306: N), processing goes back to the step S302. When determination in the step S306 results in that there is standardized impedance Z1 (step S306: Y), the standardized impedance Z1 is stored in a storage unit (not shown) (step S307). Incidentally, when standardized impedance Z1 has been already stored, the standardized impedance Z1 is updated to newly obtained standardized impedance Z1.

Then, the calculator 53 determines, based on the standardized impedance Z calculated in the step S303, whether there is standardized impedance Z2 or not (step S308). When determination in the step S308 results in that there is no standardized impedance Z2 (step S308: N), processing goes back to the step S302. When determination in the step S308 results in that there is standardized impedance Z2 (step S308: Y), the standardized impedance Z2 is stored in a storage unit (not shown) (step S309) and processing is terminated.

In this manner, measurement of impedance and calculation of standardized impedance Z in the steps S302 to S309 are repeatedly performed until two regions different in current density to make the value of standardized impedance Z constant, that is, first and second Tafel regions 61 and 62 shown in FIG. 27B are detected. The impedance acquired by the impedance acquisition unit 52 in the condition that the first and second Tafel regions 61 and 62 are detected can be judged to be impedance in a stable power generation state. The impedance acquired by the impedance acquisition unit 52 is stored in the measurement evaluator 50 suitably so that the stored impedance can used for evaluation of the fuel cell 200. Incidentally, after a stable power generation state is confirmed by the aforementioned procedure, measurement of impedance, etc. may be executed newly so that the fuel cell 200 in the stable power generation state can be evaluated variously.

FIGS. 29A and 29B are graphs illustrating current-voltage characteristic and standardized impedance obtained at a stage of an unstable power generation state before detection of the first and second Tafel regions 61 and 62.

In examples shown in FIG. 29A, only a diffusion region appears with respect to current-voltage characteristic and standardized impedance because the fuel cell 200 is not in a stable power generation state, so that standardized impedance Z1 and standardized impedance Z2 cannot be confirmed in the two. FIG. 29B shows a state where time has passed further, so that standardized impedance Z1 of the first Tafel region 61 can be confirmed. However, standardized impedance Z2 cannot be confirmed because the fuel cell 200 in this stage is not in a stable power generation state. In this manner, standardized impedance Z1 is first confirmed and standardized impedance Z2 can be confirmed when the state of the fuel cell 200 comes closer to a stable power generation state. When the fuel cell 200 reaches a stable power generation state, standardized impedance Z1 and standardized impedance Z2 can be confirmed (FIG. 27B).

In this manner, when standardized impedance Z which is the product of impedance and current density is calculated and used as an index for the power generation state of the fuel cell 200 by measuring impedance of the fuel cell 200 while measuring characteristic of the fuel cell 200, the power generation state of the fuel cell 200 can be confirmed and grasped. That is, determination as to whether the fuel cell 200 is in a stable power generation state or not, can be executed automatically by an arithmetic operation in the calculator 53 based on plots of such standardized impedance Z.

Moreover, when a graph or the like showing current-voltage characteristic and standardized impedance is presented by the indicator 54, characteristic of the fuel cell 200 and a situation, etc. during measurement can be confirmed visually. For example, when a graph in which standardized impedance Z is plotted versus the logarithm of current density acquiring the impedance is displayed, two regions (standardized impedance values Z1 and Z2) different in current density to make the value of standardized impedance Z constant can be recognized visually so that the stable power generation state of the fuel cell 200 can be confirmed and grasped easily.

Generally, for evaluation of characteristic of the fuel cell 200, reproducible voltage-current characteristic (Tafel curve) must be obtained. It is however necessary to true up the measurement condition to obtain reproducibility because it is known that reproducible voltage-current characteristic (Tafel curve) varies according to the environmental condition or preprocessing condition etc. of measurement. However, in accordance with the fuel cell evaluator according to this embodiment, plots of standardized impedance Z are used so that the power generation state of the fuel cell 200 can be confirmed easily without any labor for adjusting the environmental condition or preprocessing condition etc. of measurement.

Moreover, standardized impedance values Z1 and Z2 can be used widely as parameters in the stable power generation state. Although the relation between standardized impedance Z1, Z2 and the stable power generation state of the fuel cell 200 has been mentioned in the aforementioned embodiment, information of standardized impedance Z can be applied widely to analysis of performance of the fuel cell. Although the aforementioned embodiment has been described in the case where measurement of current-voltage characteristic is used as measurement of characteristic of the fuel cell, evaluation of characteristic requiring measurement in a stable power generation state can be applied widely.

As described above, in accordance with the fuel cell evaluator according to this embodiment, the impedance acquisition unit 52 acquires impedance of the fuel cell 200 by changing the current value while measuring characteristic of the fuel cell, the calculator 53 calculates standardized impedance which is the product of impedance acquired by the impedance acquisition unit 52 and current density at the time of acquiring the impedance, and the indicator 54 presents the standardized impedance calculated by the calculator 53 as a stable power generation state signal of the fuel cell 200. Accordingly, the standardized impedance can be presented easily as an index for the power generation state of the fuel cell 200 without any labor for adjusting the environmental condition or preprocessing condition etc. of measurement. In addition, information of standardized impedance can be used as useful analytic data.

The applicable scope of the invention is not limited to the aforementioned embodiments. The invention can be applied widely to a fuel cell evaluator or the like for evaluating characteristic in a power generation state of a fuel cell.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A fuel cell evaluator for evaluating a characteristic of a fuel cell based on a frequency characteristic of impedance of the fuel cell, the evaluator comprising:
   an impedance acquisition unit configured to acquire impedances of the fuel cell for a certain current value in a Tafel region by changing a measurement frequency;
   an extraction unit configured to extract a reaction resistance from the acquired impedances;
   a calculator configured to calculate the product of the reaction resistance and the certain current value;
   an indicator configured to indicate the product calculated by the calculator as the frequency characteristic of the impedance of the fuel cell; and
   a storage configured to store the product of the reaction resistance and the certain current value,
   wherein the extraction unit is configured to extract the reaction resistance by removing DC resistance components not involved in the reaction resistance from the impedances,
   wherein the extraction unit is configured to remove the DC resistance components by using model fitting, the model fitting extracting the reaction resistance as a reaction arc,
   wherein the calculator is configured to determine a state of the fuel cell by comparing products of reaction resistance and certain current value for respective current densities in two different Tafel regions.

2. The fuel cell evaluator according to claim 1, wherein the extraction unit is configured to remove the DC resistance components in a distributed constant region.

3. The fuel cell evaluator according to claim 2, wherein the distributed constant region comprises a region having $\theta$-f characteristics of $45°\pm5°$.

4. The fuel cell evaluator according to claim 1, wherein
   the impedance acquisition unit is configured to acquire impedances of the fuel cell for a plurality of current values in a plurality of Tafel regions;
   the extraction unit is configured to extract reaction resistances from the acquired impedances; and
   the calculator is configured to calculate the product of each of the reaction resistances and the corresponding current value.

5. The fuel cell evaluator according to claim 1, further comprising a load controller to regulate at least one of voltage and current for the fuel cell.

6. The fuel cell evaluator according to claim 1, further comprising a gas supply controller configured to regulate a ratio of a flow rate of oxygen to a flow rate of nitrogen for the fuel cell.

7. A fuel cell evaluation method for evaluating a characteristic of a fuel cell based on a frequency characteristic of impedance of the fuel cell, the method comprising:
   (a) acquiring impedances of the fuel cell for a certain current value in a Tafel region by changing a measurement frequency;
   (b) extracting a reaction resistance from the acquired impedances;
   (c) calculating the product of the reaction resistance and the certain current value;
   (d) indicating the calculated product as the frequency characteristic of the impedance of the fuel cell;
   (e) determining a state of the fuel cell by comparing products of reaction resistance and certain current value for respective current densities in two different Tafel regions, and (f) storing the product of the reaction resistance and the certain current value in a storage,
wherein the extracting the reaction resistance comprises removing DC resistance components not involved in the reaction resistance from the impedances by using model fitting, the model fitting extracting the reaction resistance as a reaction arc.

8. A fuel cell evaluator for evaluating a characteristic of a fuel cell in a power generation state, the evaluator comprising:
an impedance acquisition unit configured to acquire impedances of the fuel cell by changing a current value while measuring a characteristic of the fuel cell;
a calculator configured to calculate standardized impedances obtained by the product of the impedances and current densities corresponding to the impedances; and
a storage configured to store the standardized impedances,
wherein the calculator is configured to extract a reaction resistance by removing DC resistance components not involved in the reaction resistance from the impedances, by using model fitting, the model fitting extracting the reaction resistance as a reaction arc,
wherein the calculator is configured to determine a state of the fuel cell by comparing the standardized impedances for respective current densities in two different Tafel regions.

9. The fuel cell evaluator according to claim 8, wherein the calculator is configured to determine that the fuel cell is in a stable power generation state, by confirming two different Tafel regions, wherein the standardized impedance for each of the current densities is constant in the respective Tafel regions.

10. The fuel cell evaluator according to claim 8, further comprising:
an indicator configured to indicate the standardized impedances as an index for the power generation state of the fuel cell.

11. A fuel cell evaluation method for evaluating a characteristic of a fuel cell in a power generation state, the method comprising:
(a) acquiring impedances of the fuel cell by changing a current value while measuring a characteristic of the fuel cell;
(b) removing DC resistance components not involved in a reaction resistance from the impedances by using model fitting, the model fitting extracting the reaction resistance as a reaction arc,
(c) calculating standardized impedances obtained by the product of the impedances and current densities corresponding to the impedances,
(d) determining a state of the fuel cell by comparing the standardized impedances for respective current densities in two different Tafel regions, and
(e) storing the standardized impedances in a storage.

12. The method according to claim 11, further comprising:
(c) determining that the fuel cell is in a stable power generation state, by confirming two different Tafel regions, wherein the standardized impedance for each of the current densities is constant in the respective Tafel regions.

* * * * *